(12) United States Patent
Chen et al.

(10) Patent No.: US 11,410,983 B2
(45) Date of Patent: Aug. 9, 2022

(54) THREE-DIMENSIONAL MEMORY DEVICE AND FABRICATION METHOD THEREOF

(71) Applicant: Yangtze Memory Technologies Co., Ltd., Hubei (CN)

(72) Inventors: Ziqi Chen, Hubei (CN); Chao Li, Hubei (CN); Guanping Wu, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/115,002

(22) Filed: Dec. 8, 2020

(65) Prior Publication Data

US 2021/0118866 A1 Apr. 22, 2021

Related U.S. Application Data

(60) Division of application No. 16/220,017, filed on Dec. 14, 2018, now Pat. No. 10,867,983, which is a
(Continued)

(30) Foreign Application Priority Data

Nov. 21, 2017 (CN) .......................... 201711166877.8

(51) Int. Cl.
*H01L 27/11575* (2017.01)
*H01L 25/00* (2006.01)
(Continued)

(52) U.S. Cl.
CPC .............. *H01L 25/50* (2013.01); *H01L 24/13* (2013.01); *H01L 24/16* (2013.01); *H01L 24/32* (2013.01);
(Continued)

(58) Field of Classification Search
CPC ......... H01L 25/50; H01L 24/13; H01L 24/16; H01L 24/32; H01L 24/81; H01L 24/83;
(Continued)

(56) References Cited

U.S. PATENT DOCUMENTS 9,041,093 B2 5/2015 Tanaka et al.
9,691,782 B1 6/2017 Hwang et al.
(Continued)

FOREIGN PATENT DOCUMENTS

CN 101647114 A 2/2010
CN 102610614 A 7/2012
(Continued)

OTHER PUBLICATIONS

International Search Report and Written Opinion of the International Searching Authority directed to related International Patent Application No. PCT/CN2018/114362, dated Feb. 12, 2019; 7 pages.

*Primary Examiner* — Mohammed R Alam
(74) *Attorney, Agent, or Firm* — Sterne, Kessler, Goldstein & Fox P.L.L.C.

(57) ABSTRACT

Methods and structures of a three-dimensional memory device are disclosed. In an example, the disclosed memory device comprises multiple staircase structures stacked over a substrate. The multiple staircase structures are positioned in a dielectric fill structure over the substrate. Each staircase structure comprises multiple gate electrodes separated by multiple insulating layers. The memory device further comprises a semiconductor channel extending from through the multiple staircase structures into the substrate. A first portion of peripheral via structures extends through the dielectric fill structure and is connected to the gate electrodes of each staircase structure. A second portion of peripheral via structures extend through the dielectric fill structure and is
(Continued)

connected to a peripheral device over the substrate and neighboring staircase structures.

16 Claims, 29 Drawing Sheets

Related U.S. Application Data continuation of application No. PCT/CN2018/114362, filed on Nov. 7, 2018.

(51) Int. Cl.

| | | |
|---|---|---|
| *H01L 27/11573* | (2017.01) | |
| *H01L 27/11582* | (2017.01) | |
| *H01L 27/1157* | (2017.01) | |
| *H01L 27/11565* | (2017.01) | |
| *H01L 23/00* | (2006.01) | |
| *H01L 25/065* | (2006.01) | |

(52) U.S. Cl.
CPC .............. *H01L 24/81* (2013.01); *H01L 24/83* (2013.01); *H01L 24/91* (2013.01); *H01L 25/0657* (2013.01); *H01L 27/1157* (2013.01); *H01L 27/11565* (2013.01); *H01L 27/11573* (2013.01); *H01L 27/11575* (2013.01); *H01L 27/11582* (2013.01); *H01L 2224/131* (2013.01); *H01L 2224/16145* (2013.01); *H01L 2224/32145* (2013.01); *H01L 2224/81895* (2013.01); *H01L 2224/83896* (2013.01); *H01L 2924/01014* (2013.01); *H01L 2924/14511* (2013.01)

(58) Field of Classification Search
CPC .................. H01L 24/91; H01L 25/0657; H01L 27/11565; H01L 27/1157; H01L 27/11573; H01L 27/11575; H01L 27/11582; H01L 2224/131; H01L 2224/16145; H01L 2224/32145; H01L 2224/81895; H01L 2224/83896; H01L 2924/01014; H01L 2924/14511

See application file for complete search history.

(56) References Cited

U.S. PATENT DOCUMENTS

| | | |
|---|---|---|
| 9,711,529 B2 | 7/2017 | Hu et al. |
| 2011/0065270 A1 | 3/2011 | Shim et al. |
| 2011/0244666 A1 | 10/2011 | Kim et al. |
| 2012/0032250 A1 | 2/2012 | Son et al. |
| 2013/0020707 A1 | 1/2013 | Or-Bach et al. |
| 2013/0134383 A1 | 5/2013 | Hwang et al. |
| 2013/0161831 A1* | 6/2013 | Hwang ................ H01L 21/768 257/775 |
| 2014/0015128 A1 | 1/2014 | Chae et al. |
| 2015/0064865 A1 | 3/2015 | Sim et al. |
| 2015/0263029 A1 | 9/2015 | Kim et al. |
| 2015/0340316 A1 | 11/2015 | Or-Bach et al. |
| 2016/0071860 A1 | 3/2016 | Kai et al. |
| 2017/0069369 A1 | 3/2017 | Kim et al. |
| 2017/0148808 A1 | 5/2017 | Nishikawa et al. |
| 2018/0247950 A1* | 8/2018 | Yun .................. H01L 27/11573 |
| 2018/0277497 A1 | 9/2018 | Matsuo |
| 2019/0221558 A1 | 7/2019 | Chen et al. |

FOREIGN PATENT DOCUMENTS

| | | |
|---|---|---|
| CN | 106206447 A | 12/2016 |
| CN | 107342291 A | 11/2017 |
| WO | WO 2017/095494 A1 | 6/2017 |

* cited by examiner

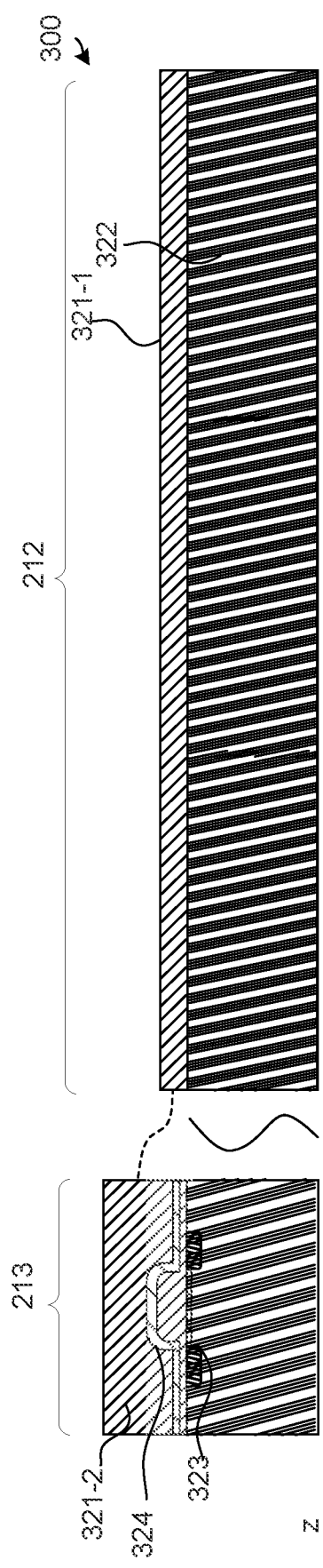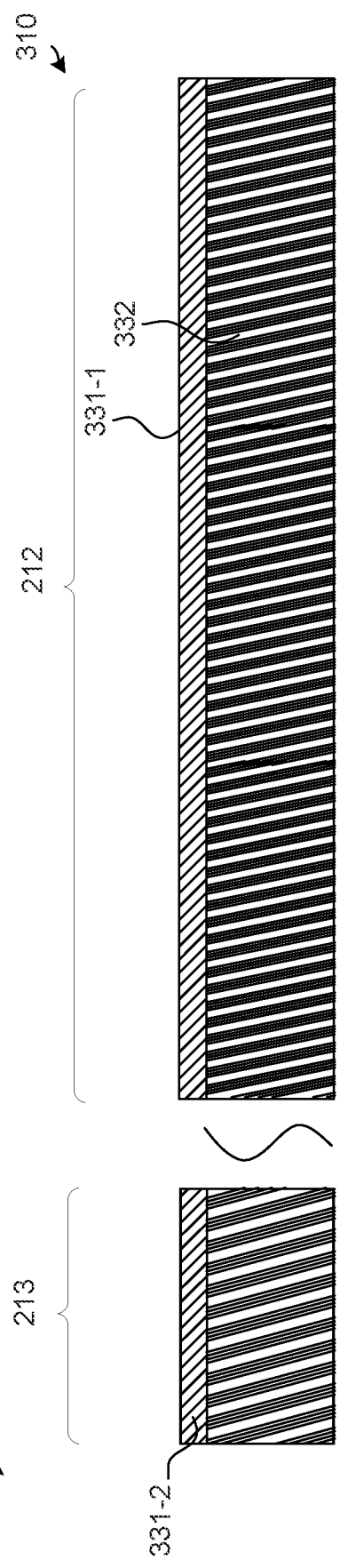

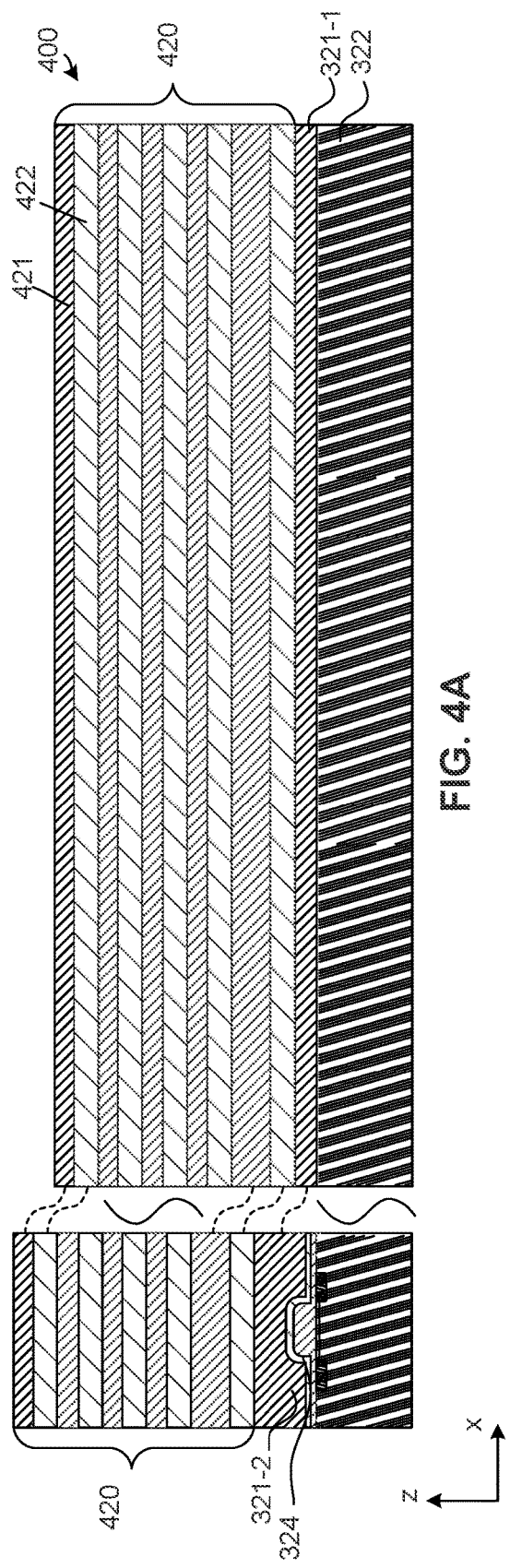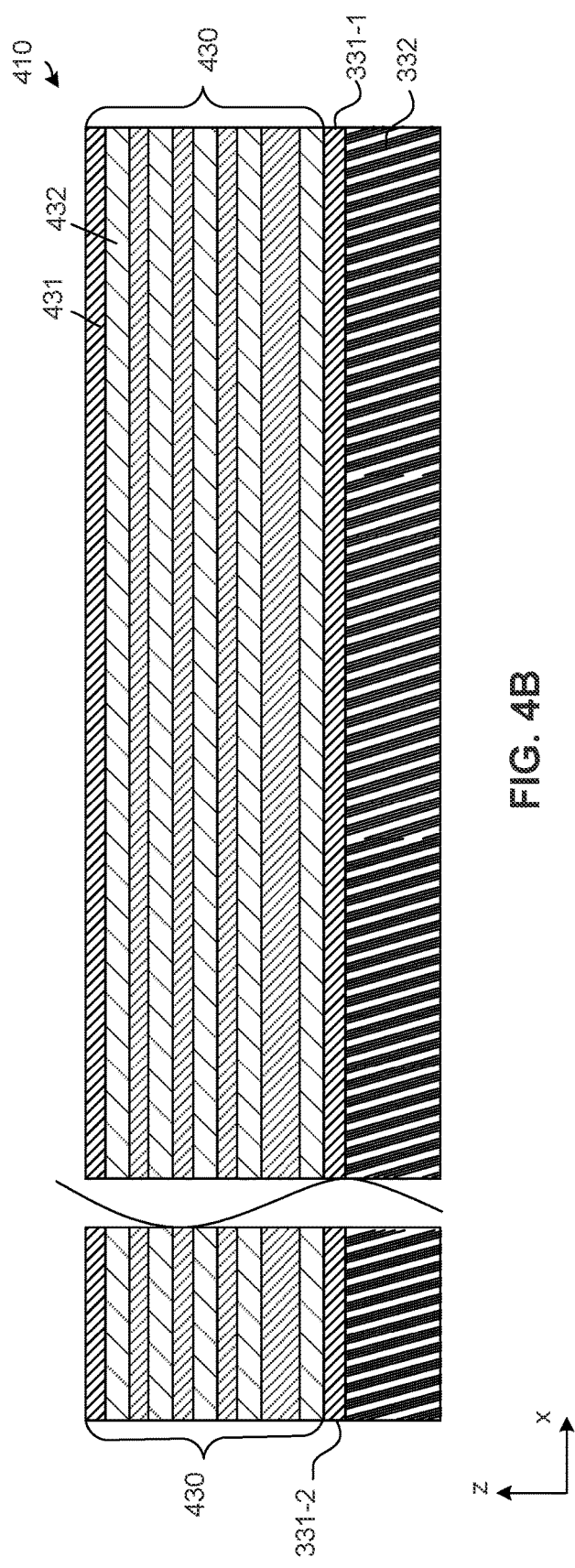
FIG. 4A
FIG. 4B

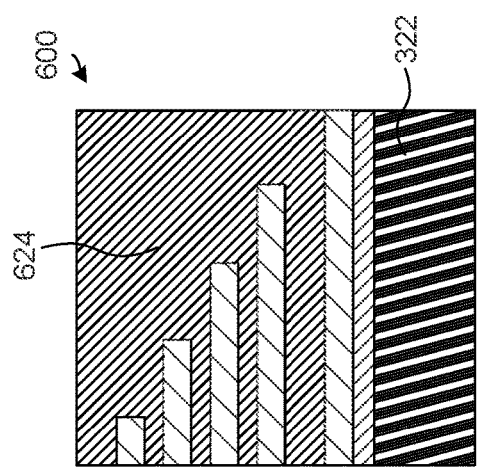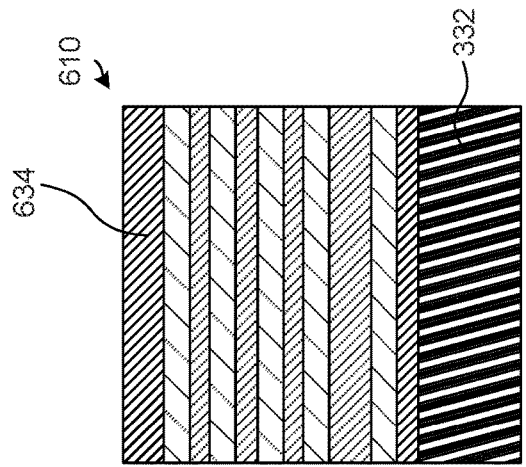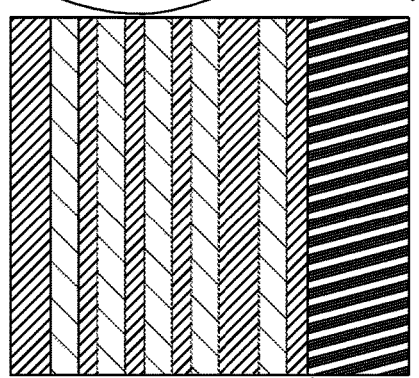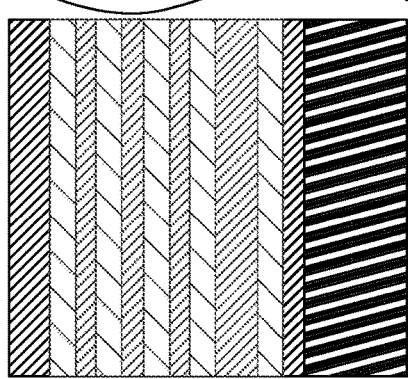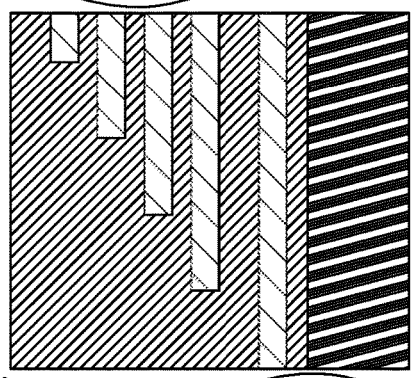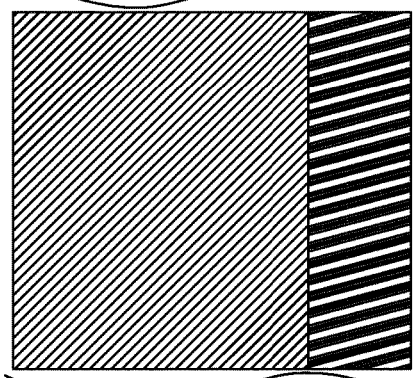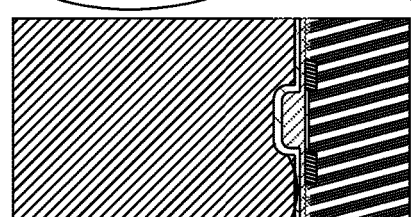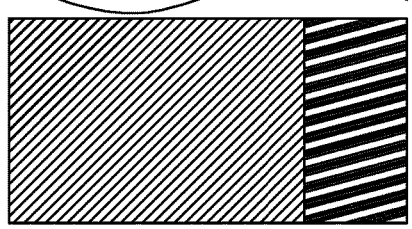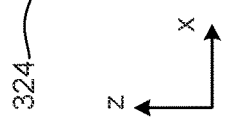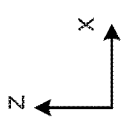
FIG. 6A
FIG. 6B

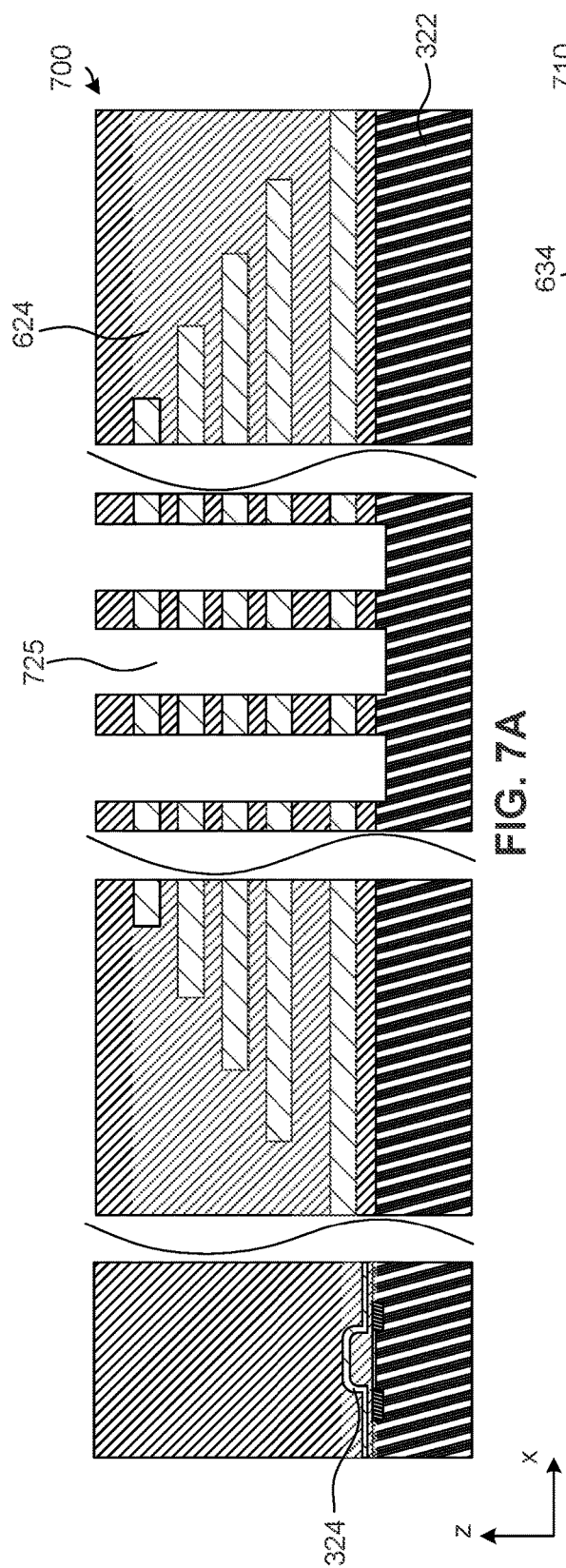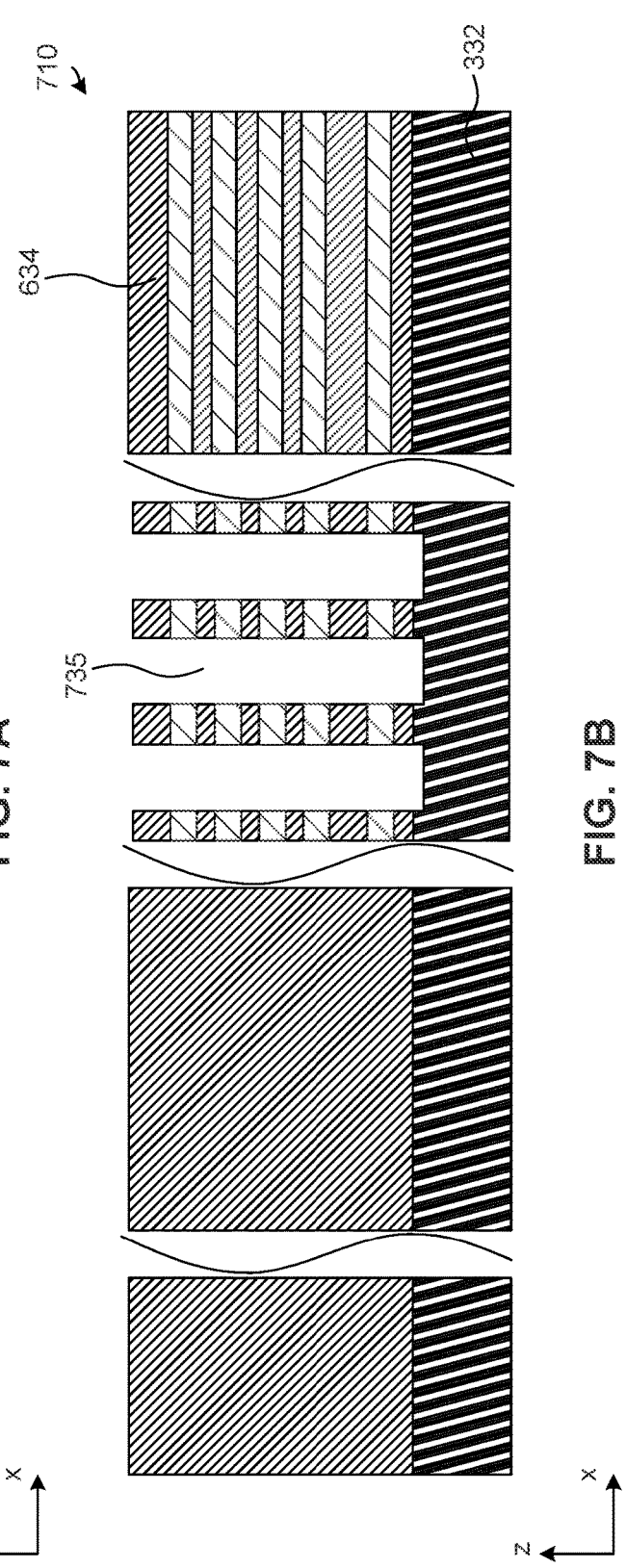
FIG. 7A
FIG. 7B

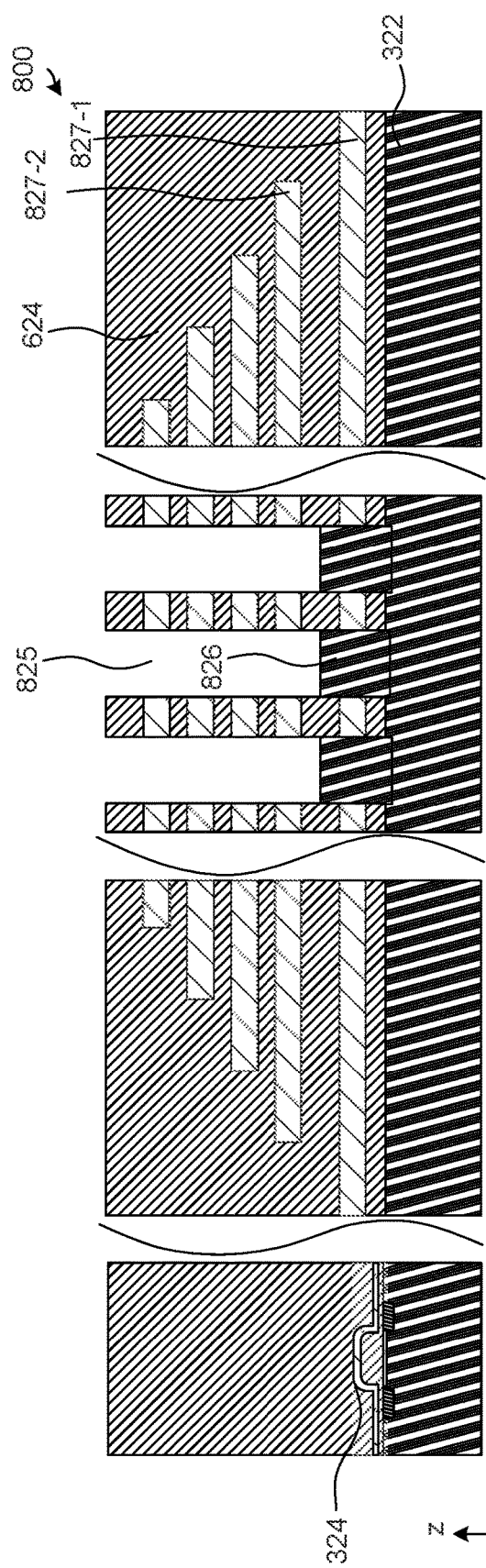
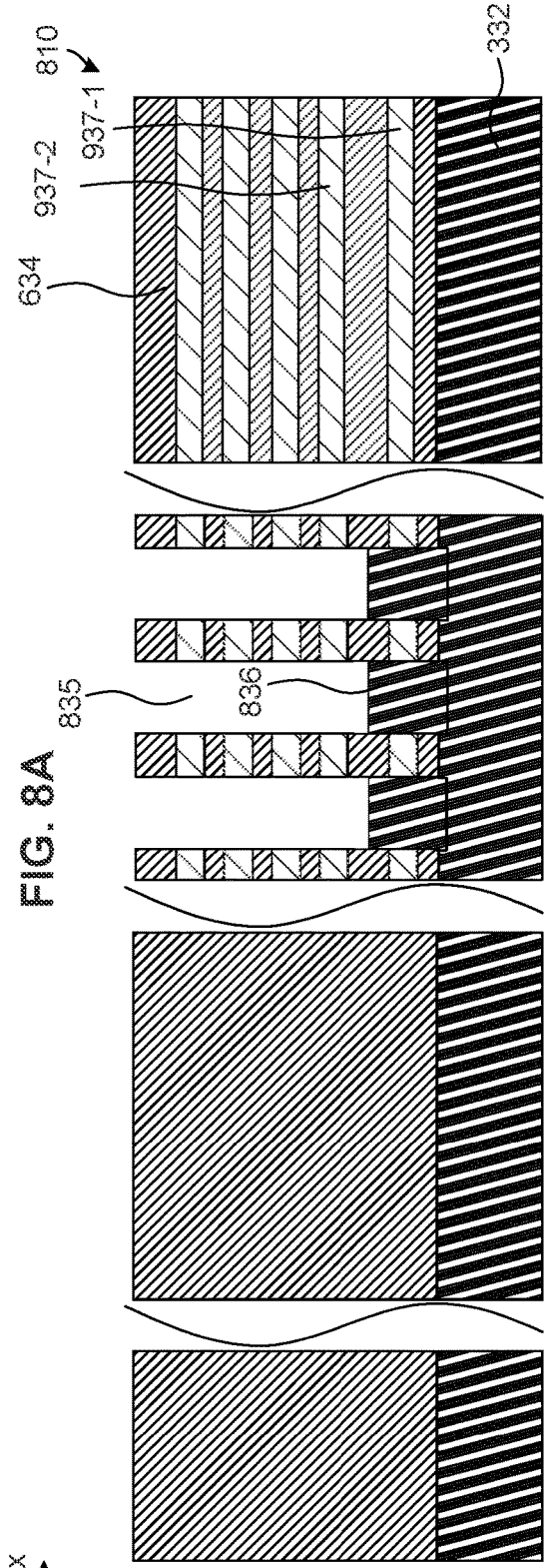
FIG. 8A
FIG. 8B

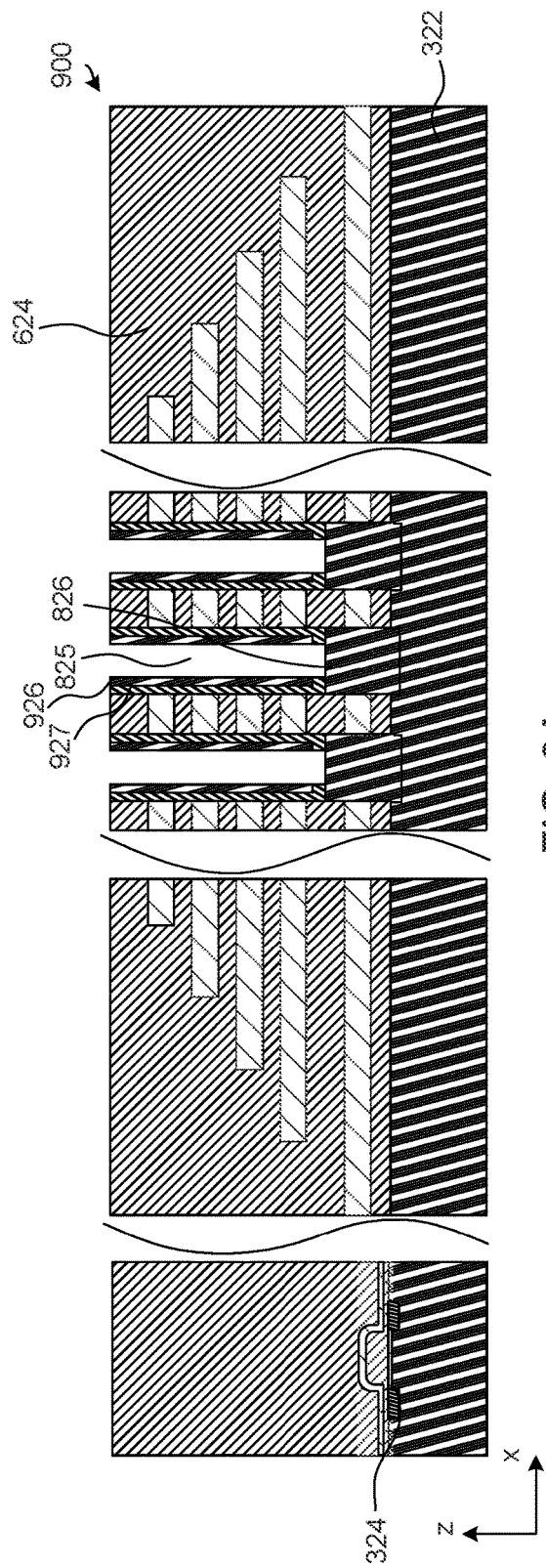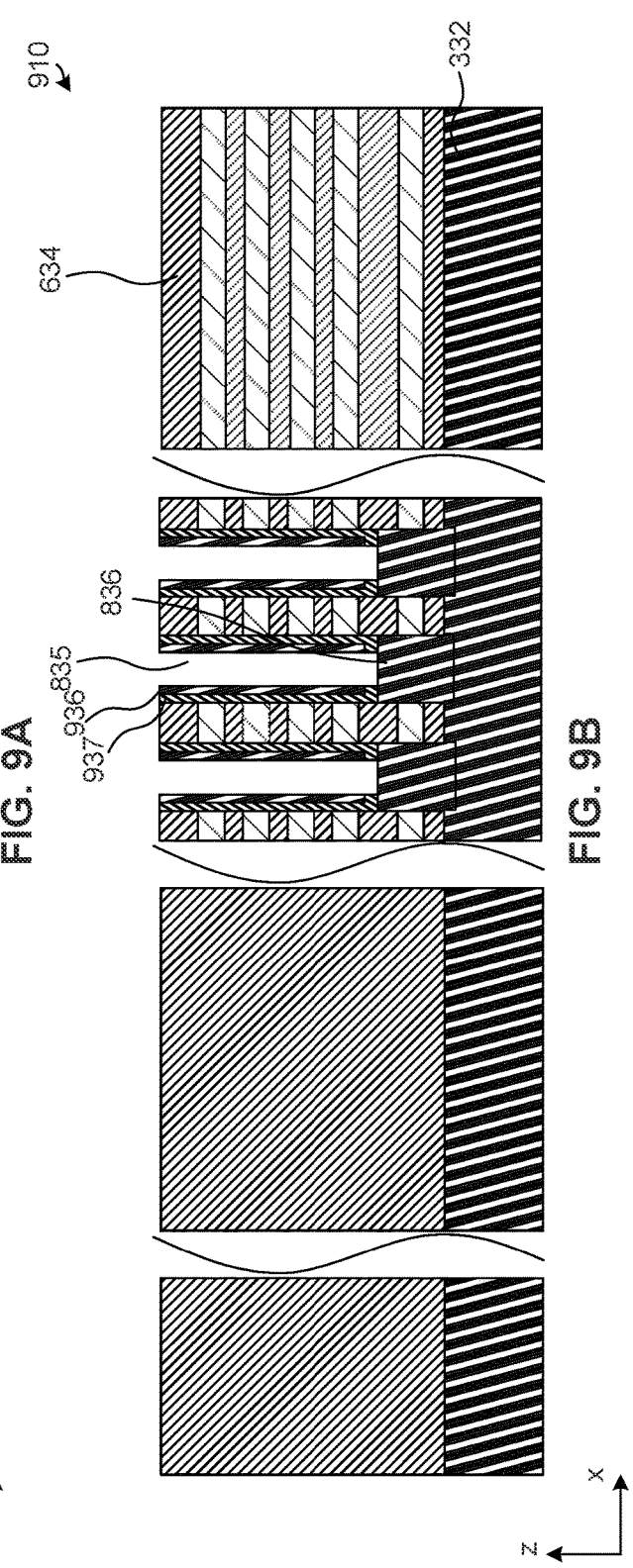
FIG. 9A
FIG. 9B

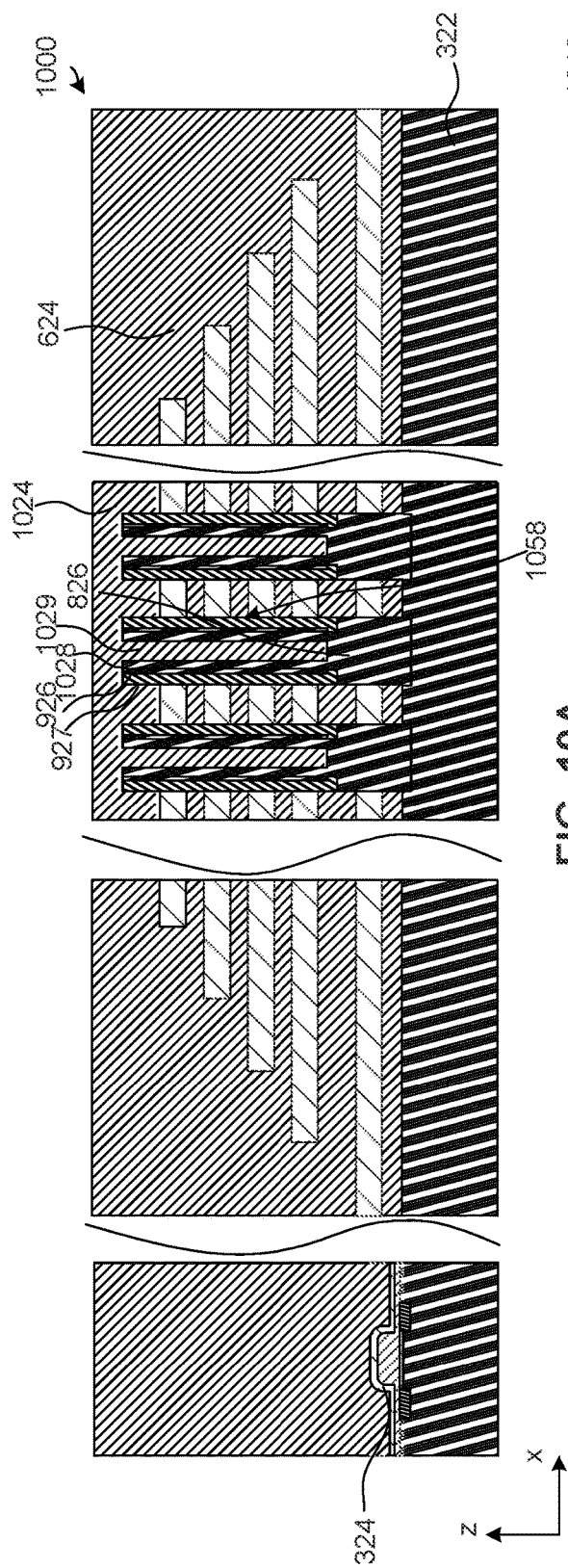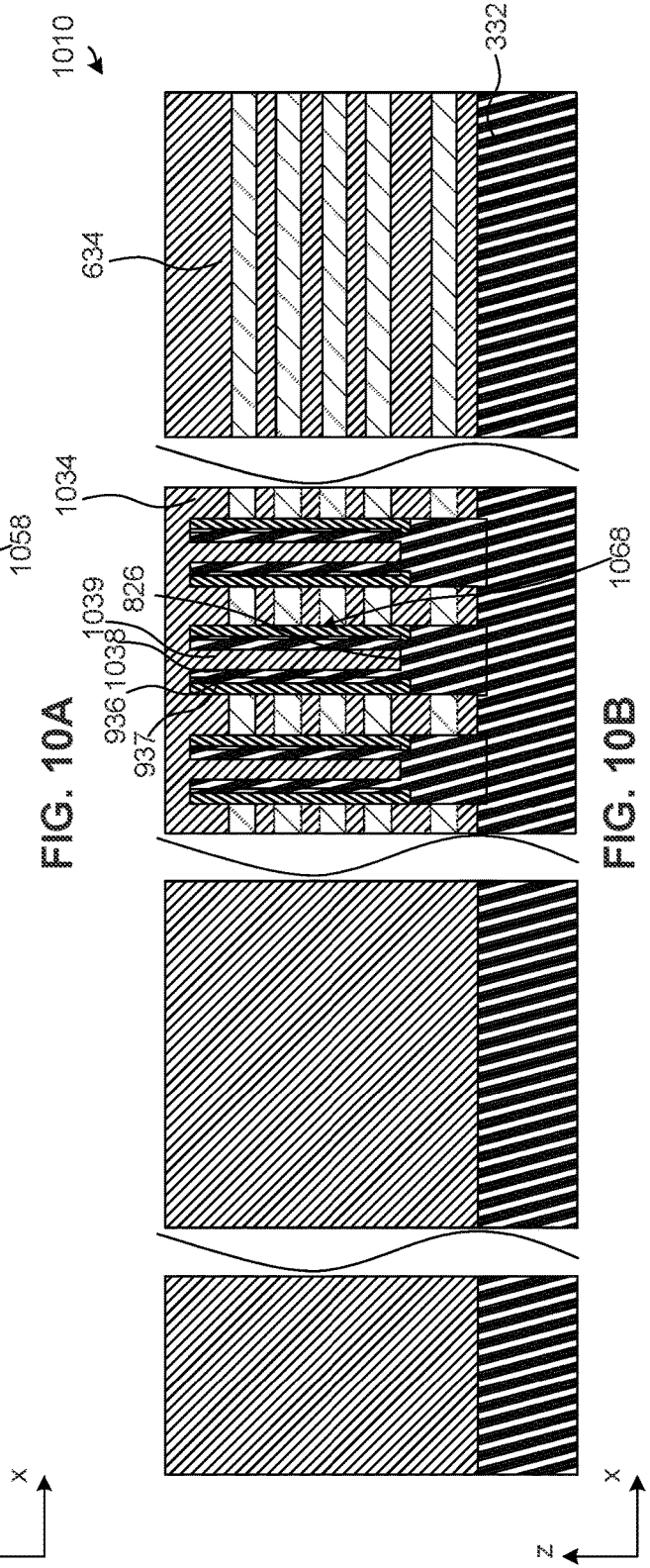

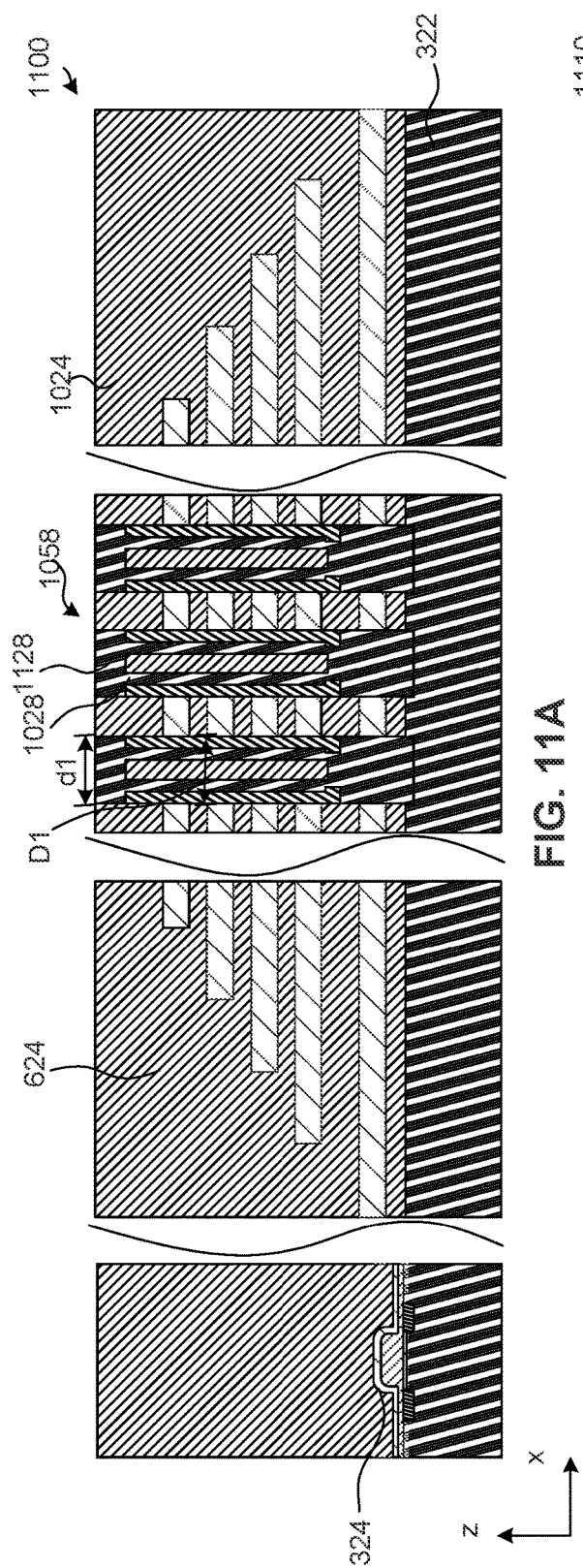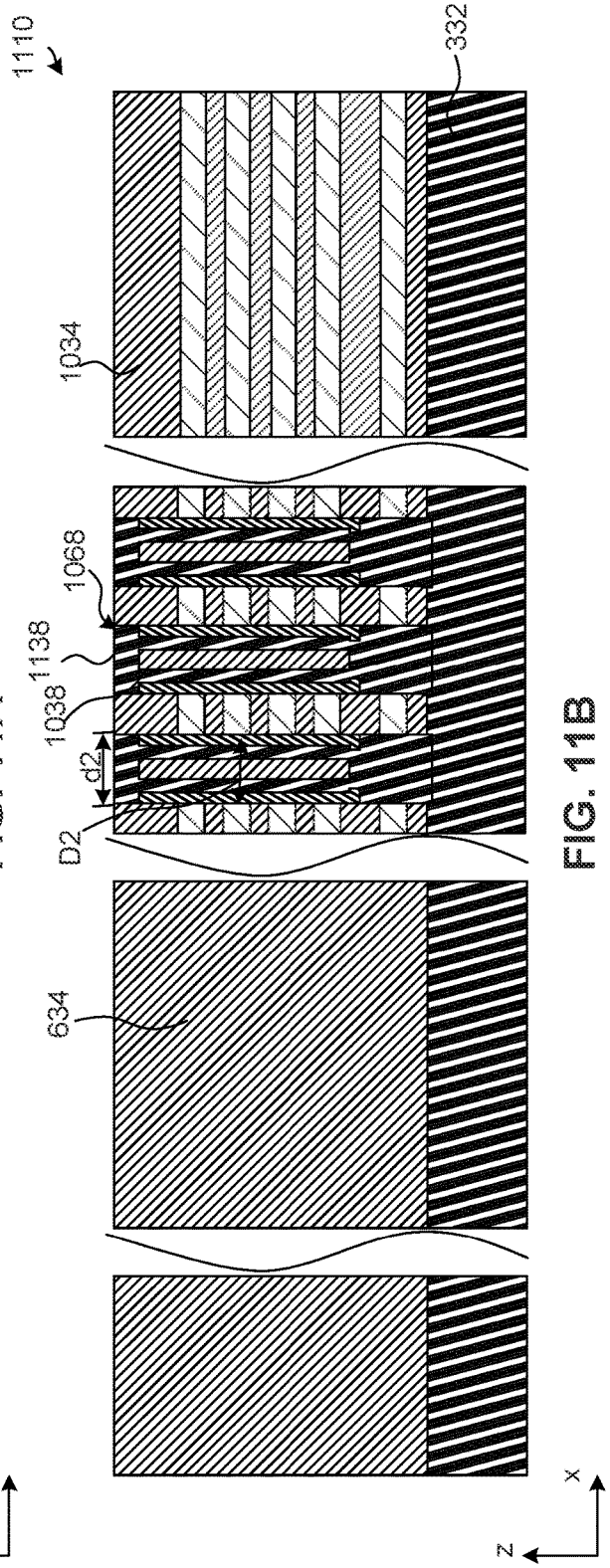
FIG. 11A
FIG. 11B

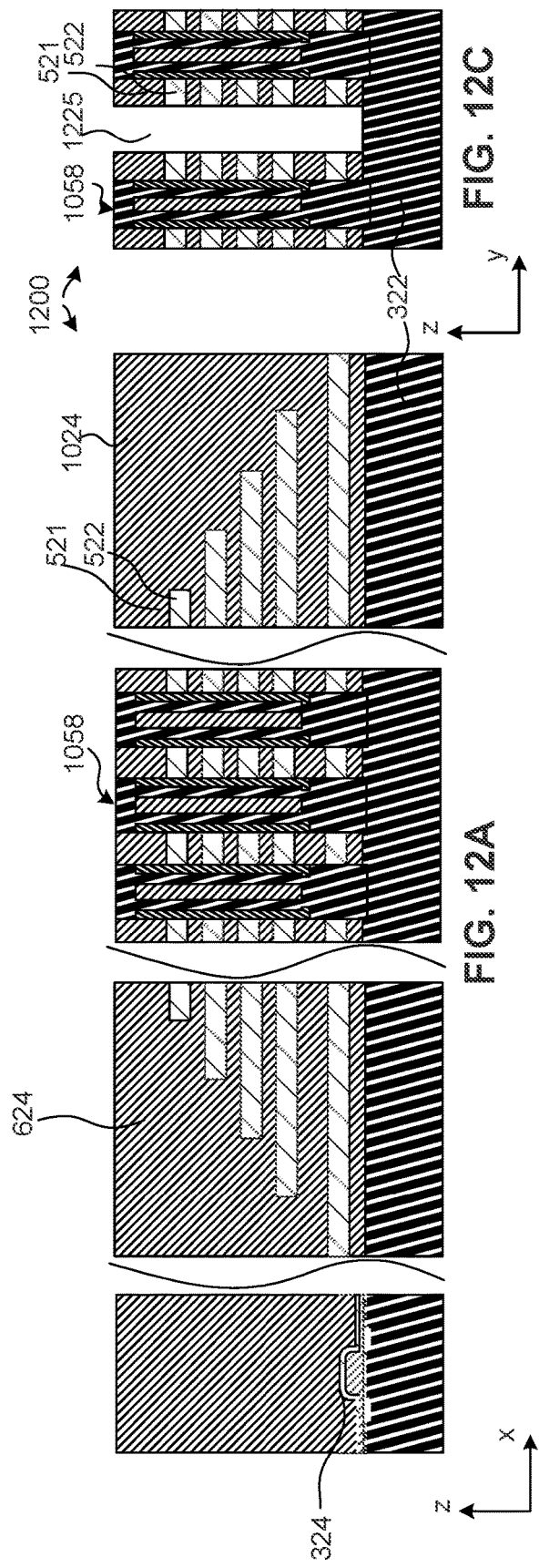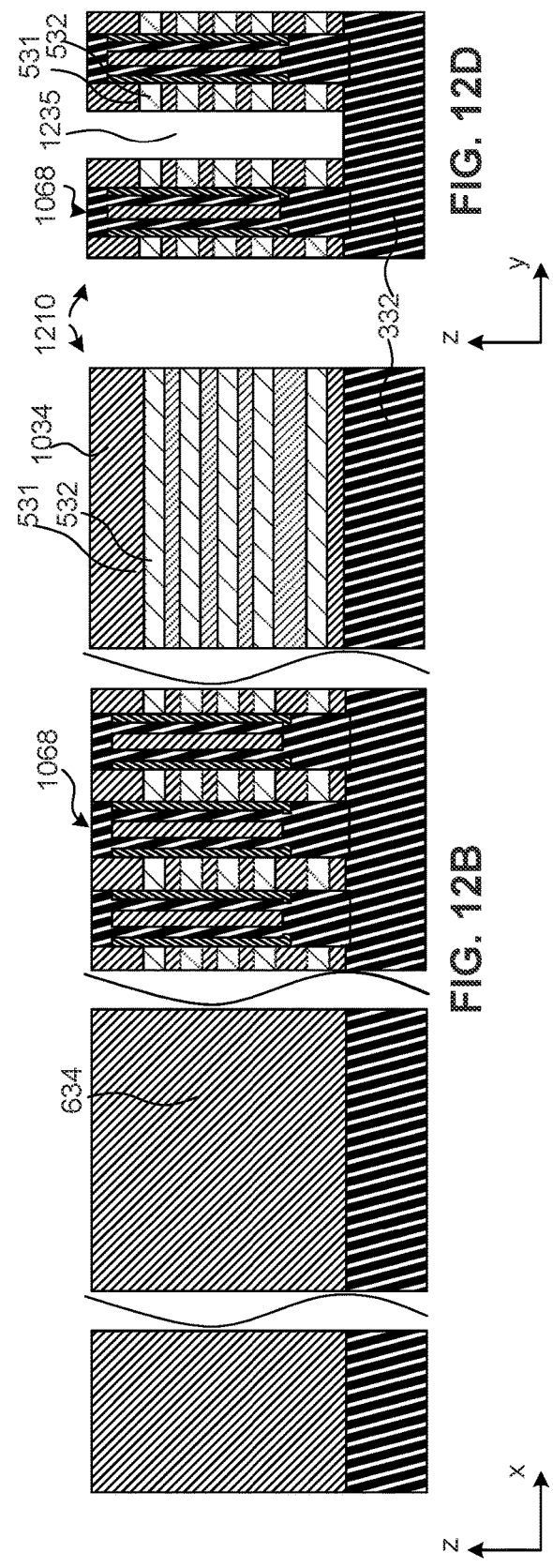

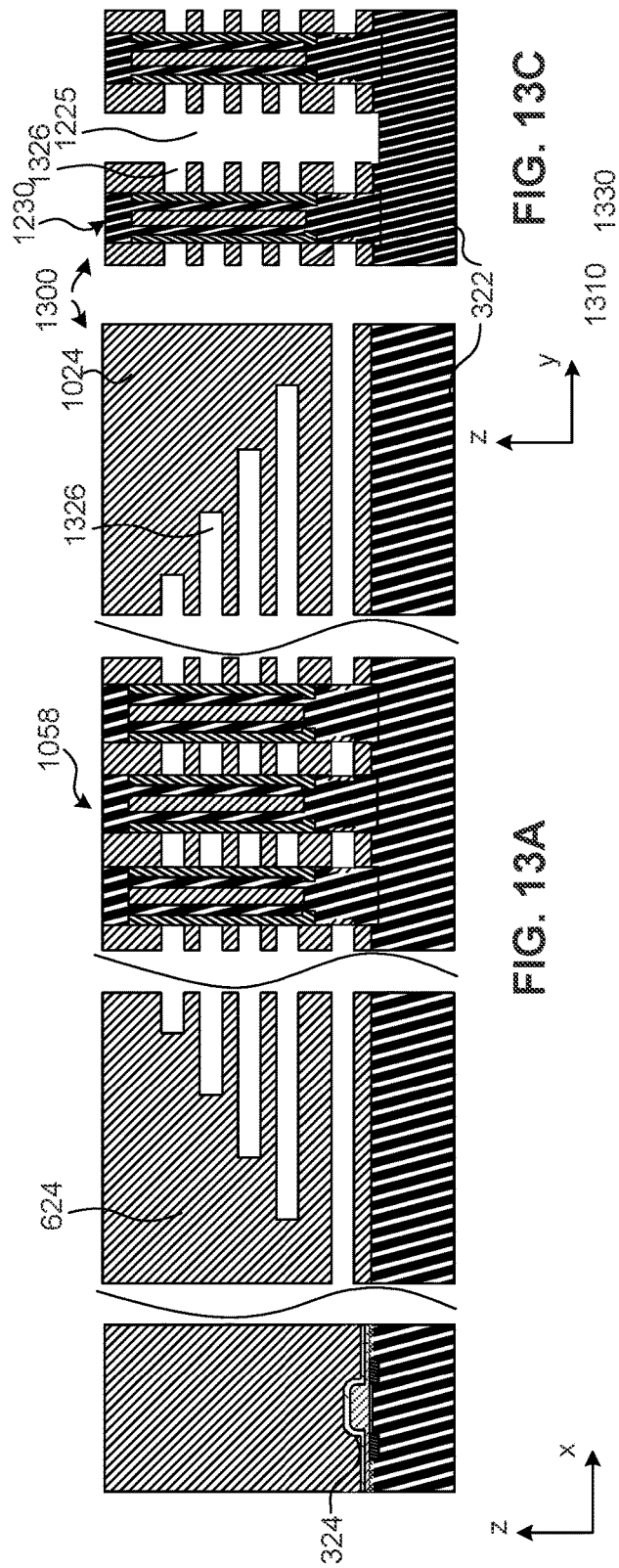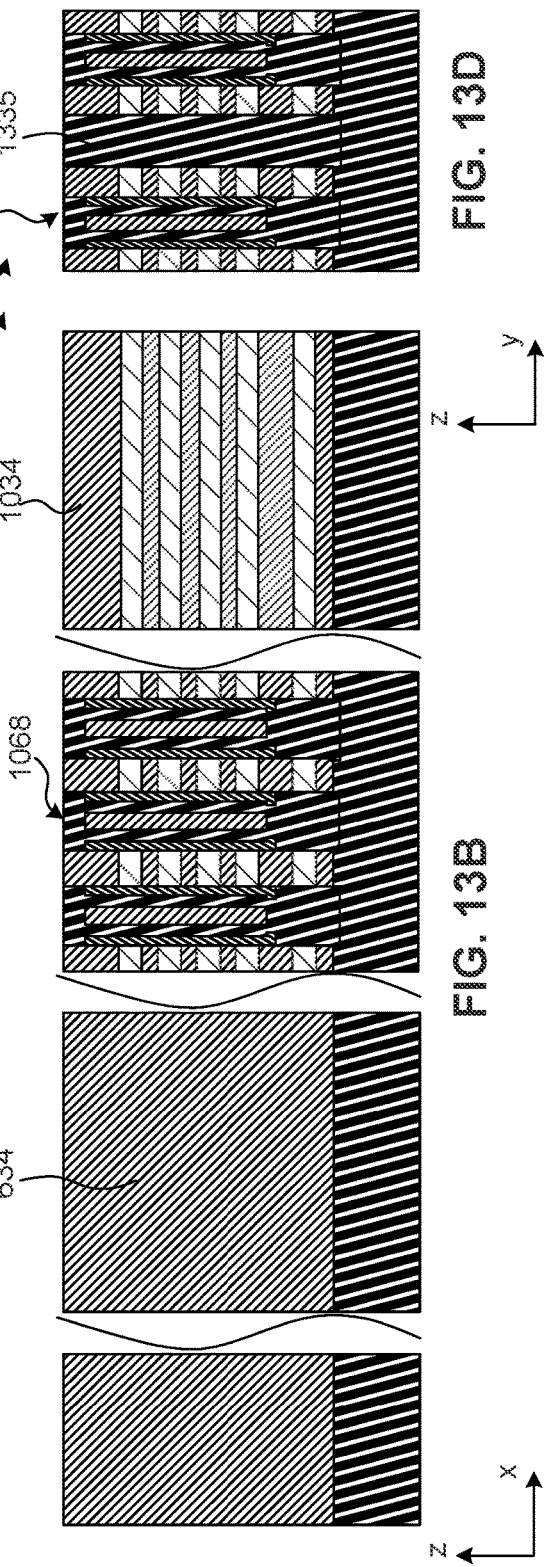

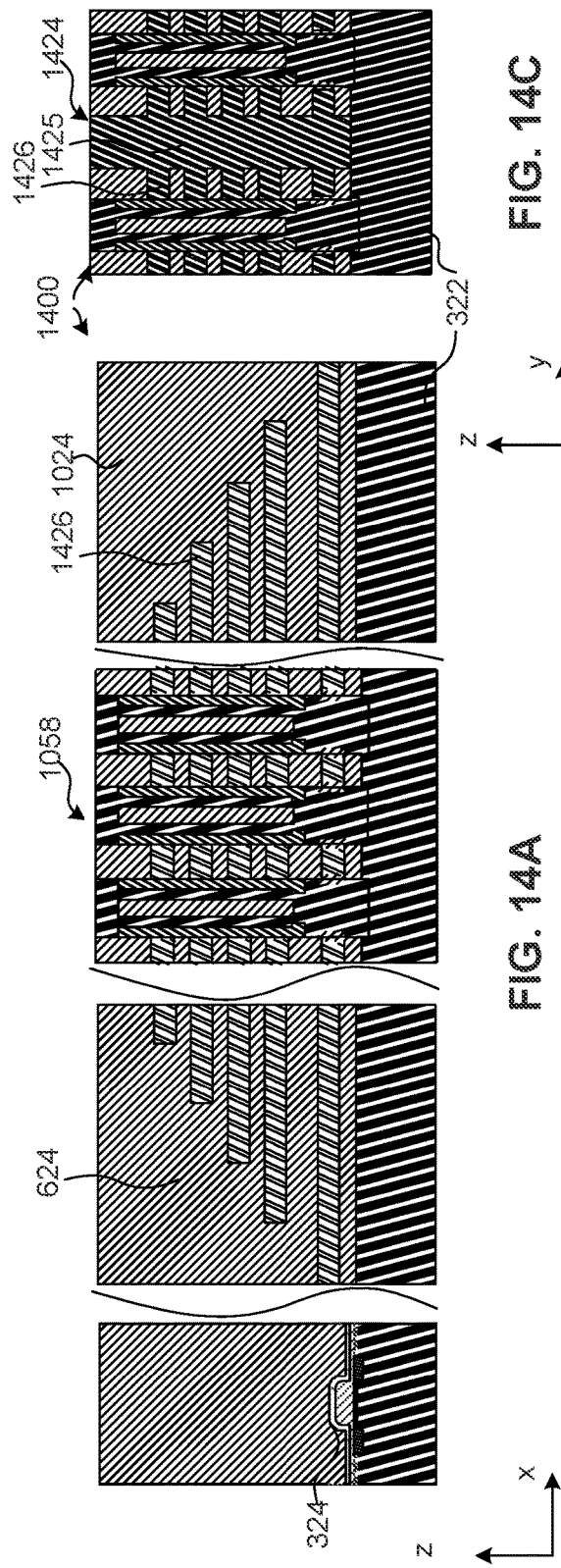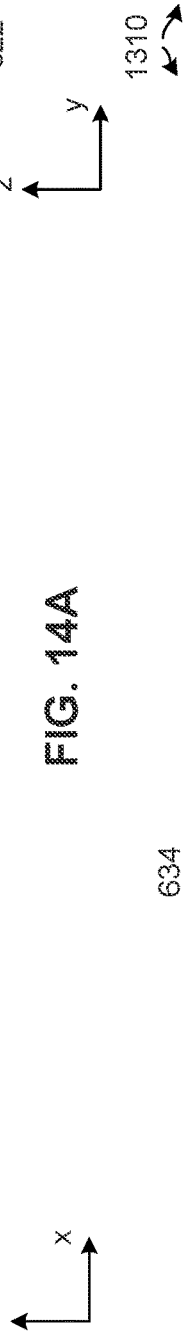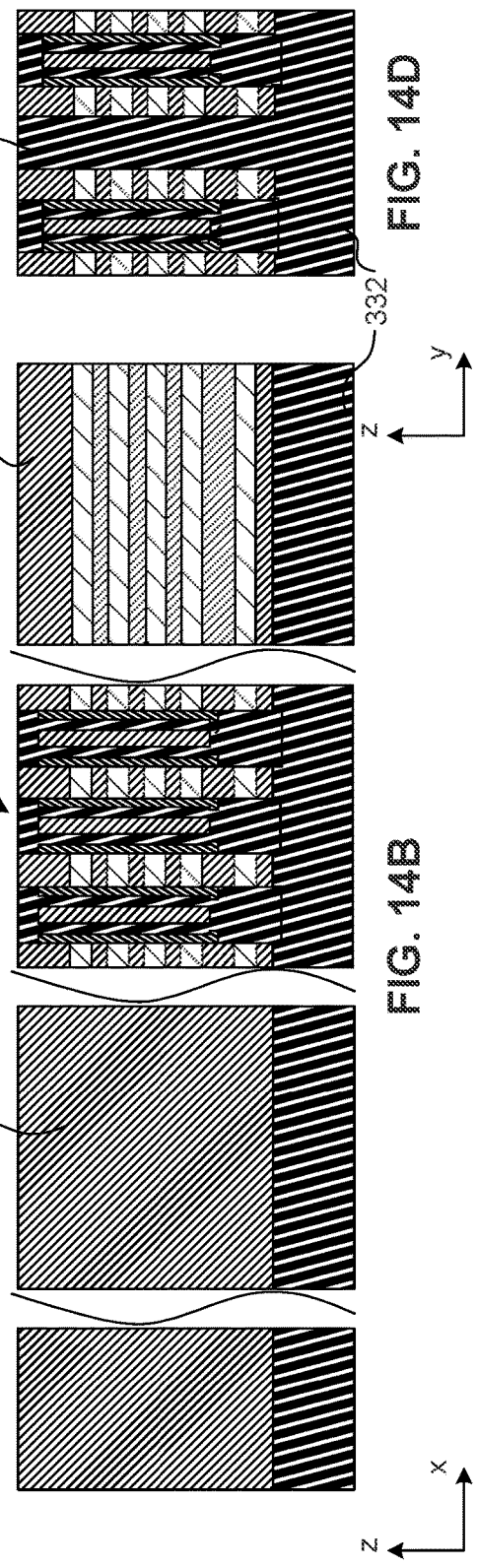

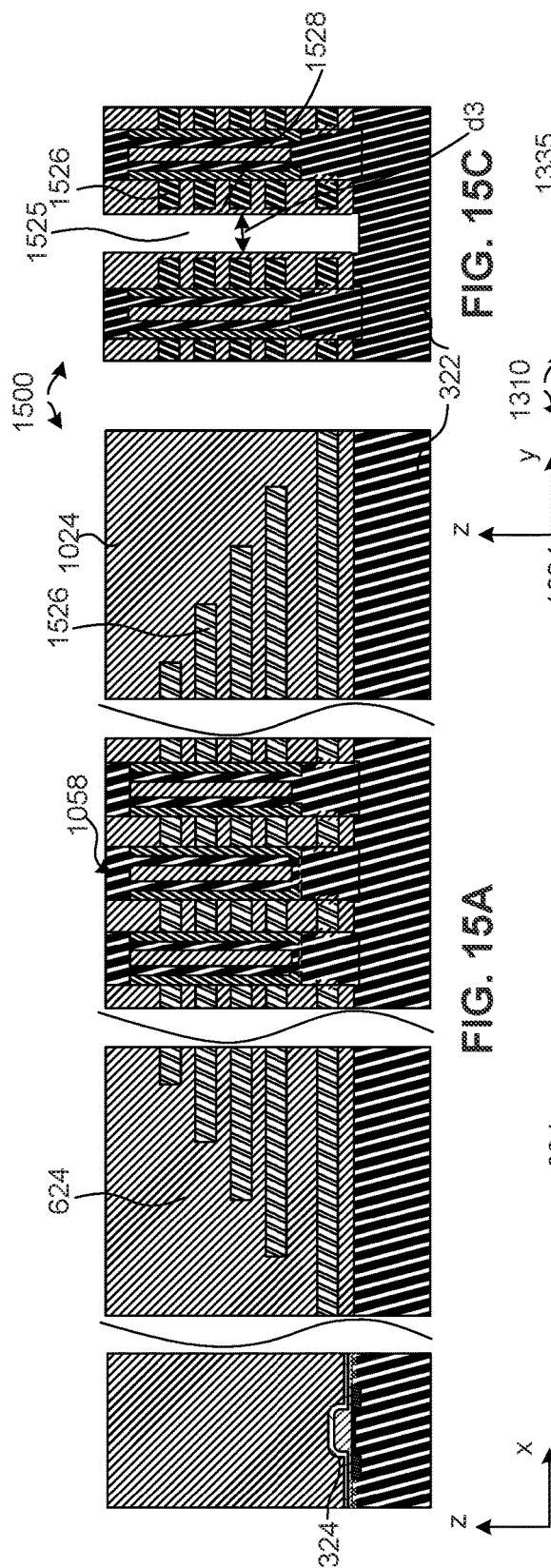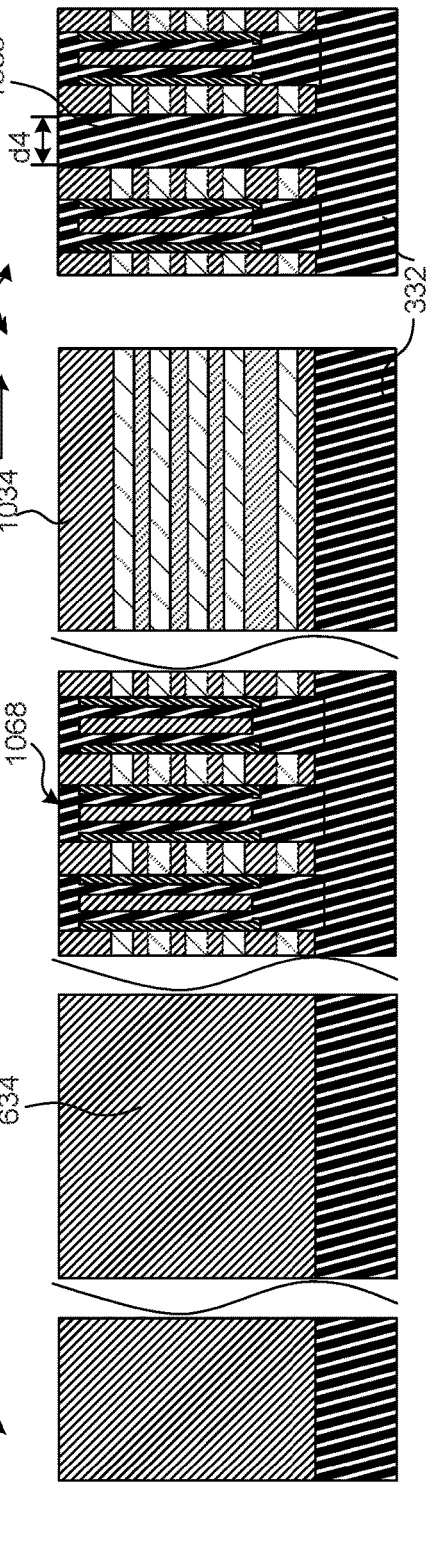

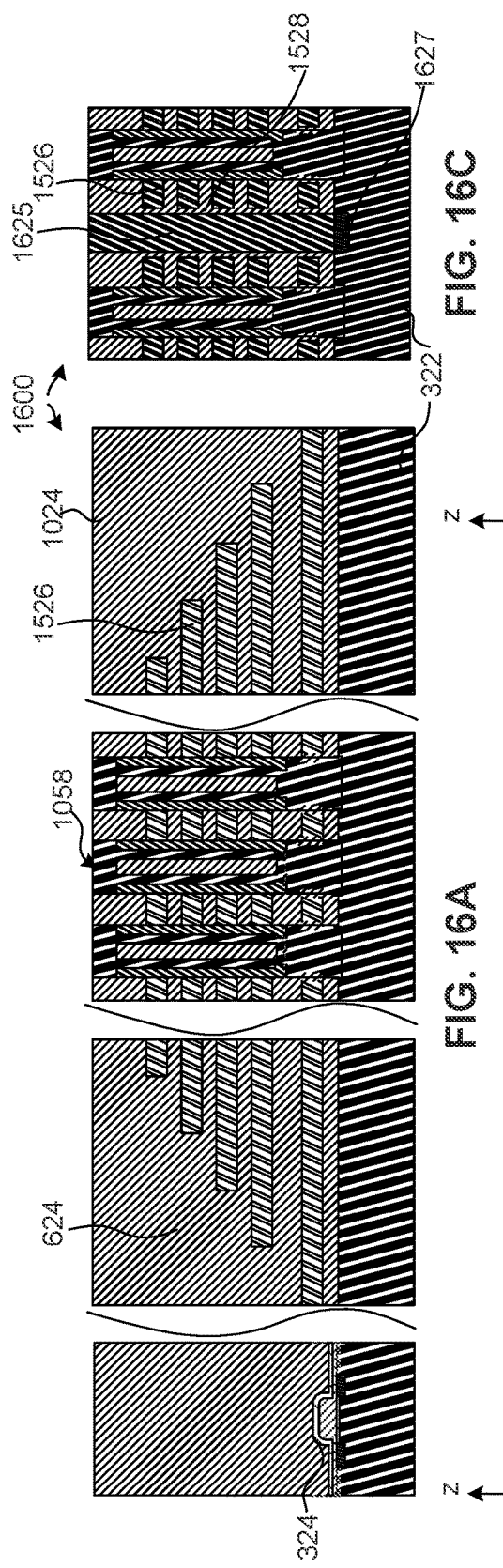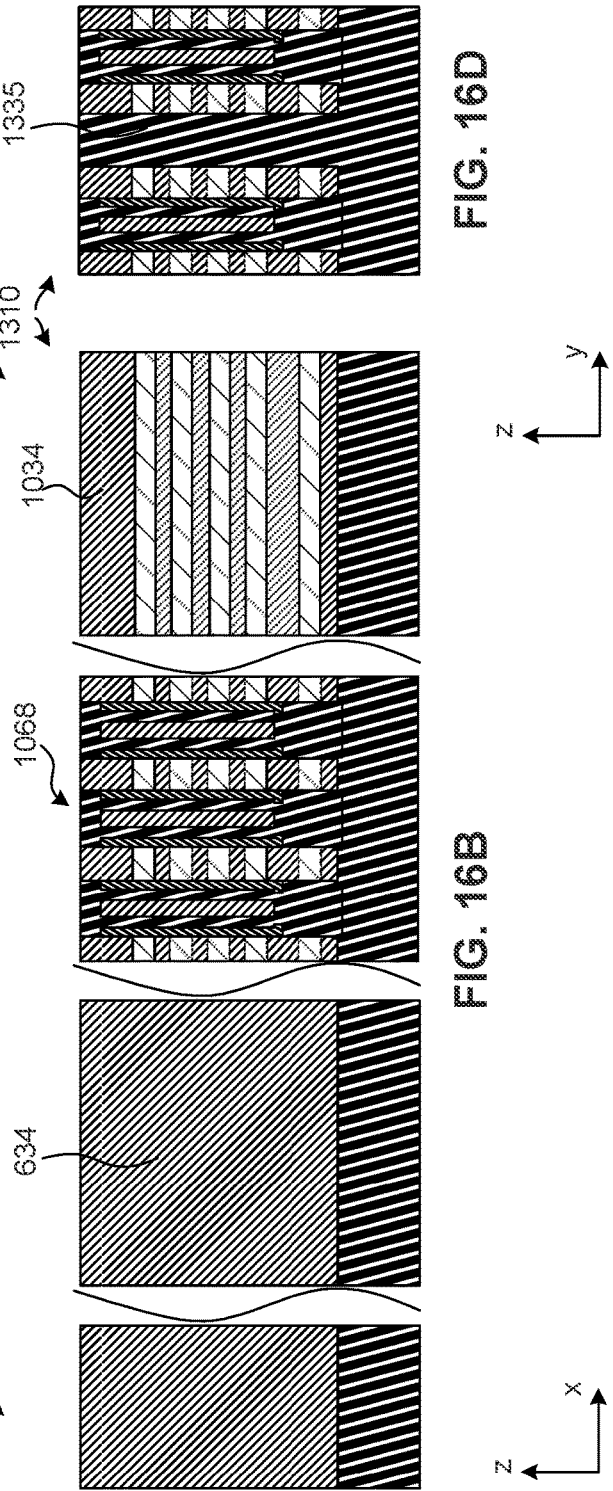

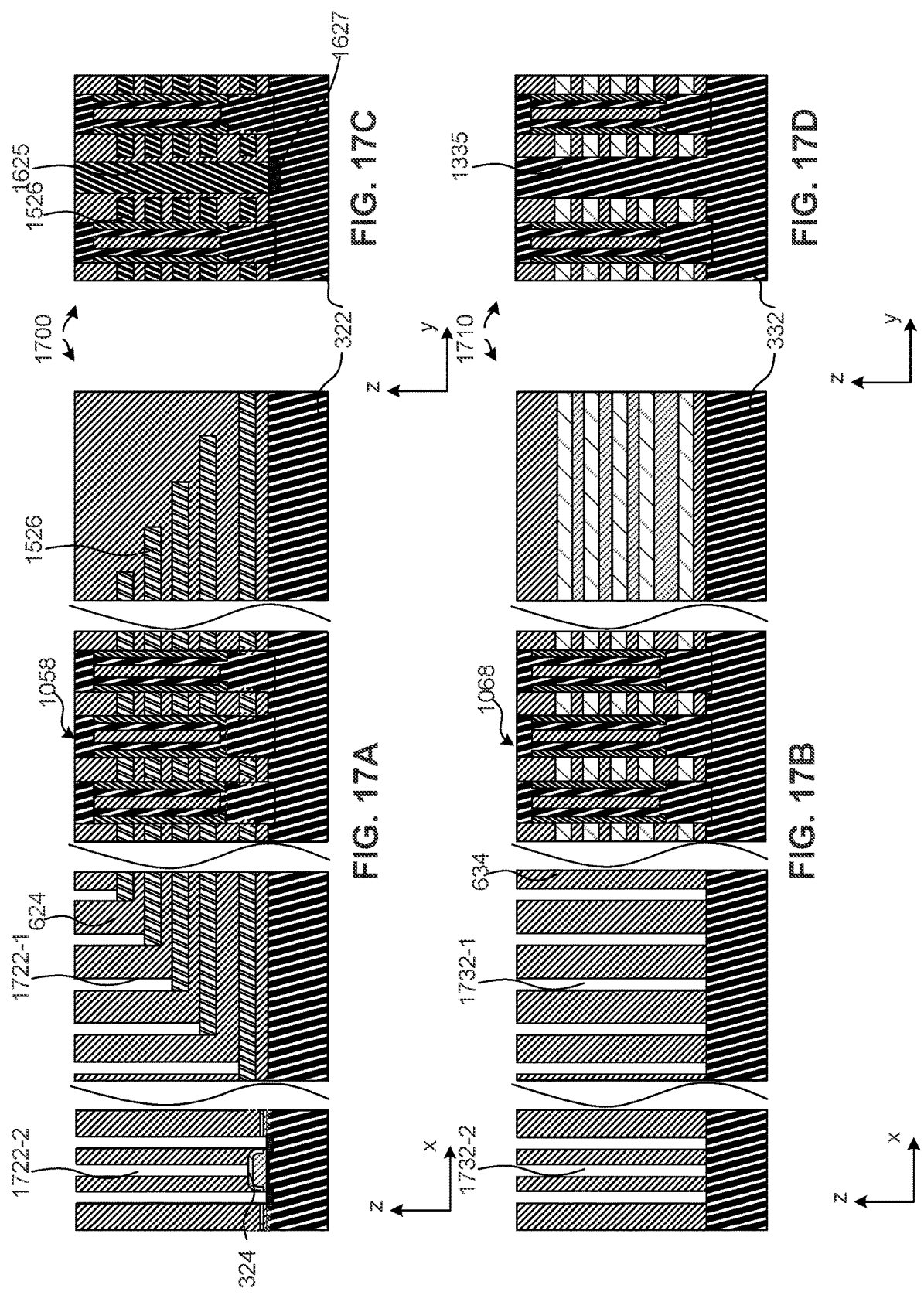

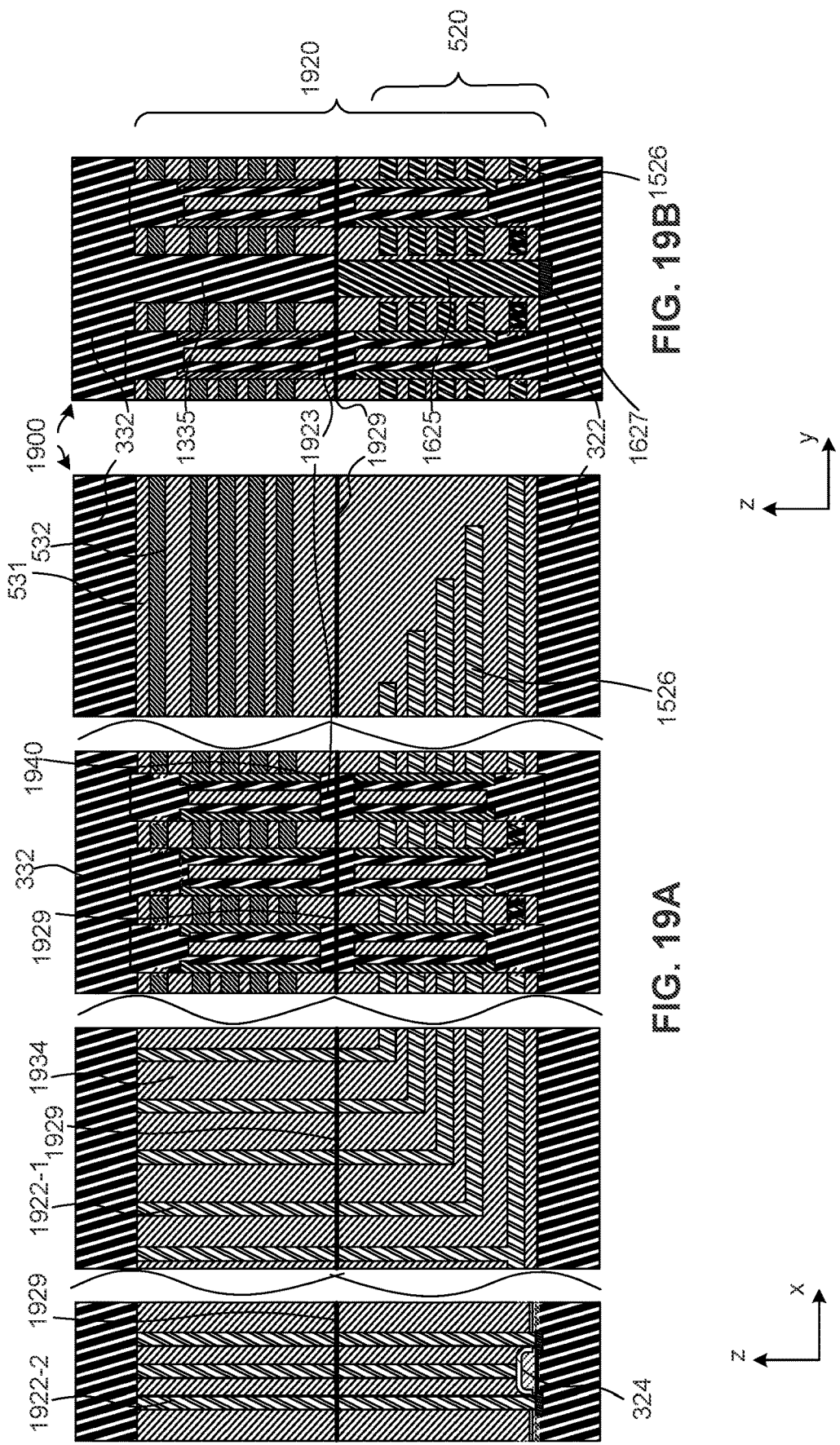

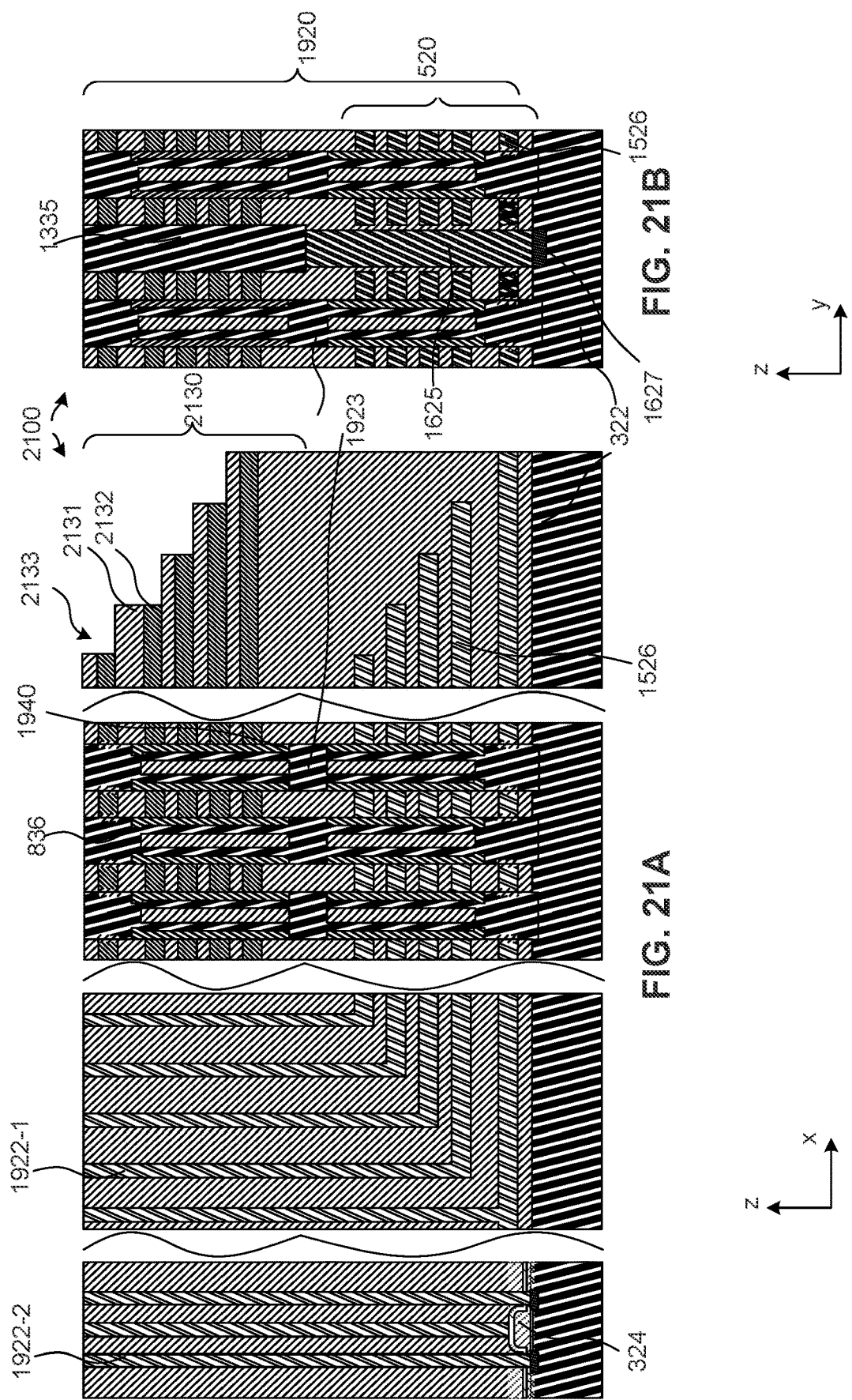

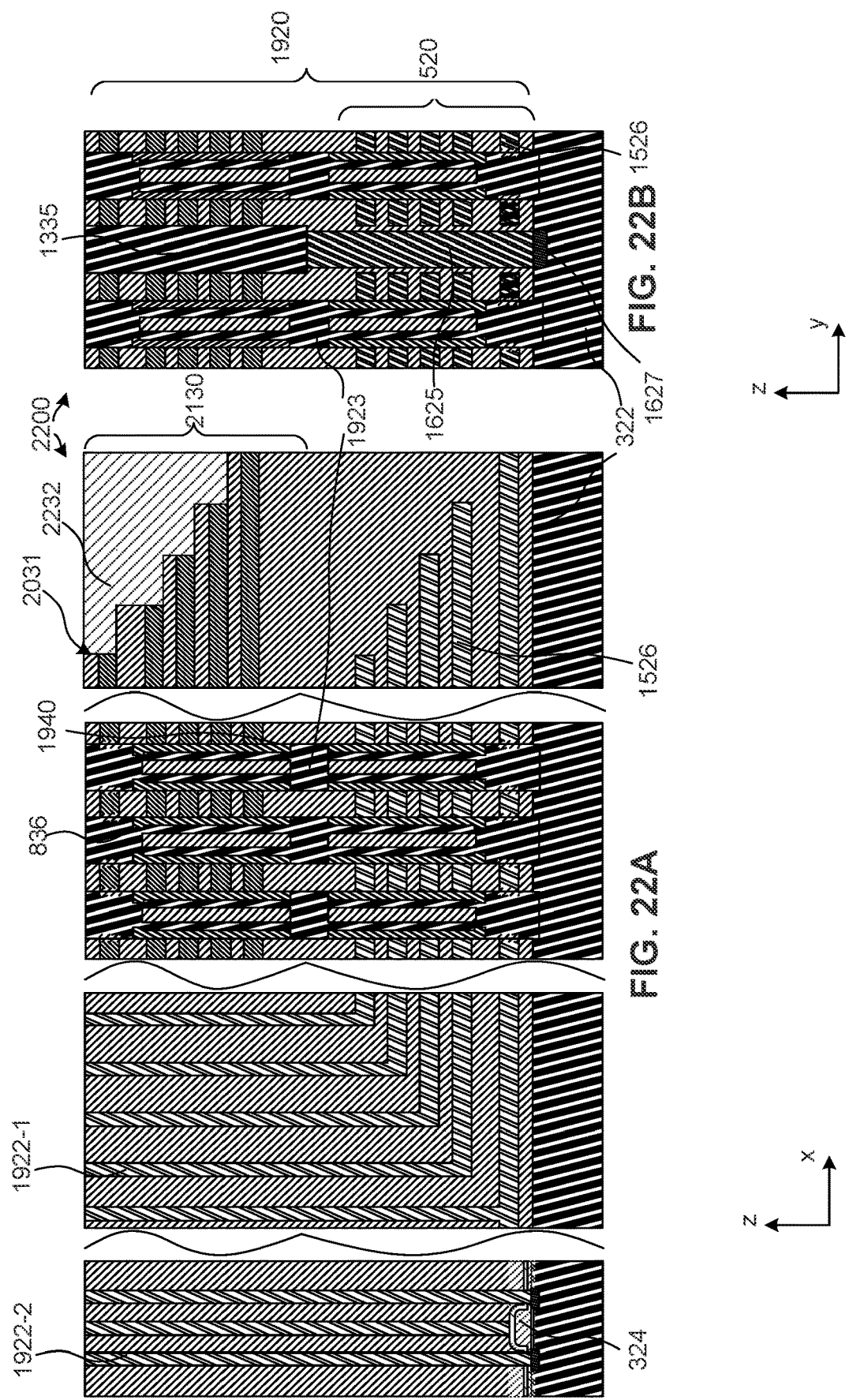

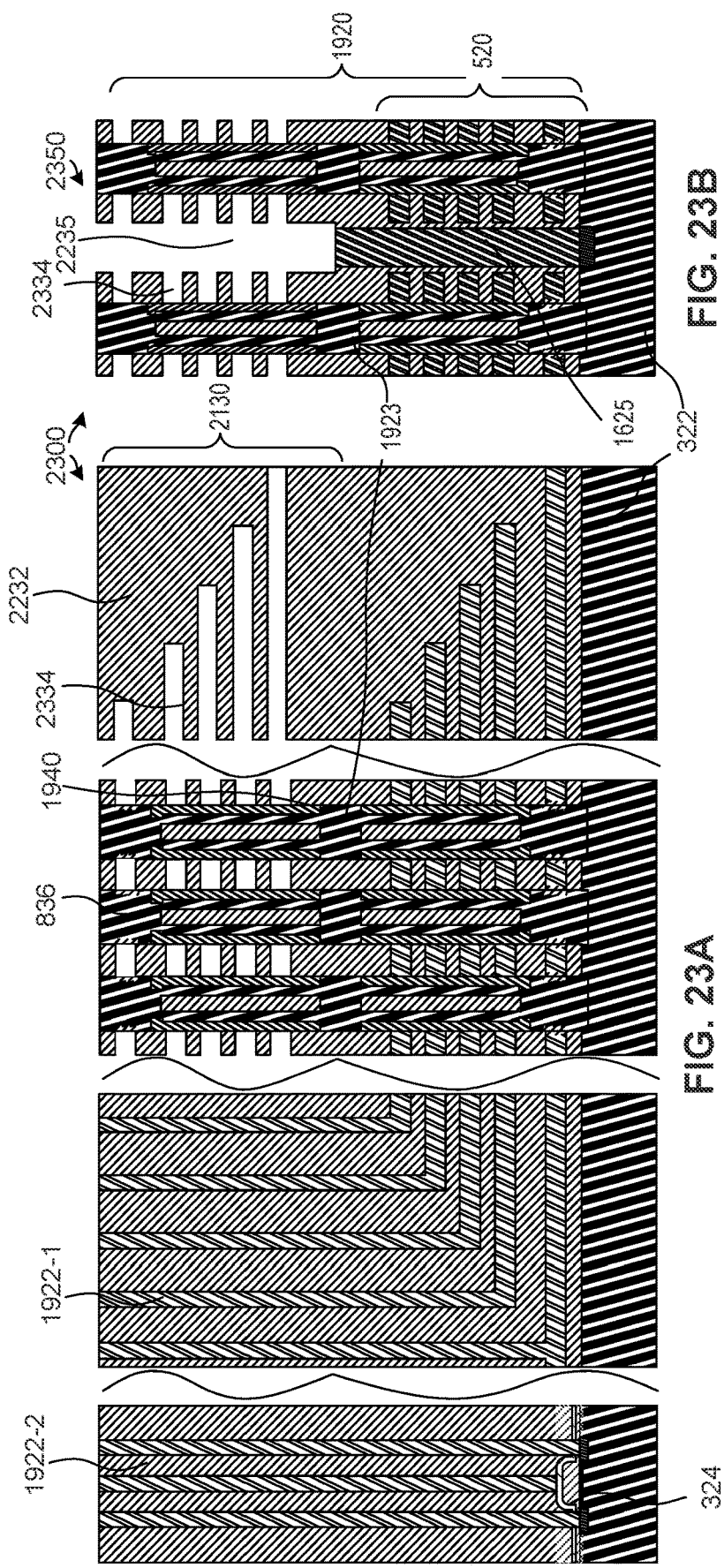

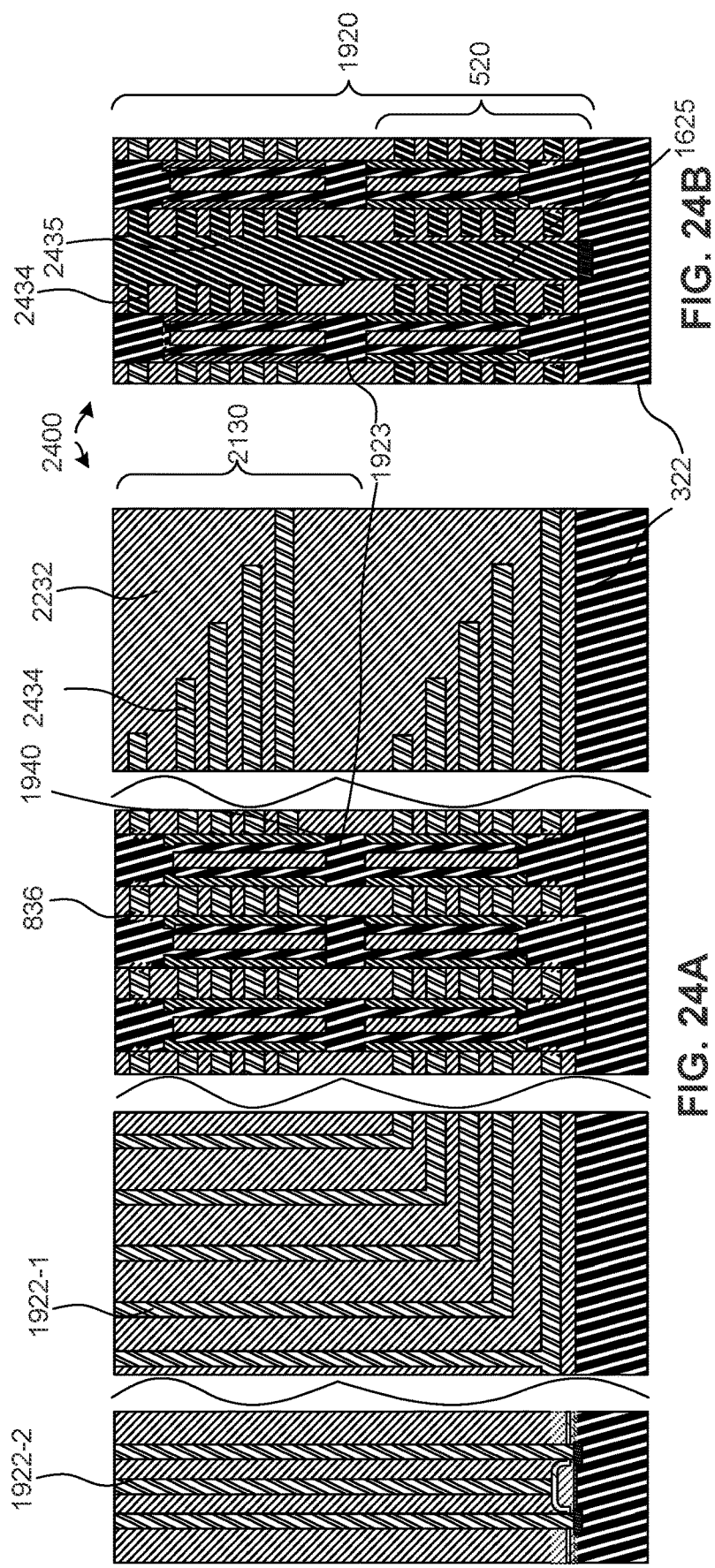

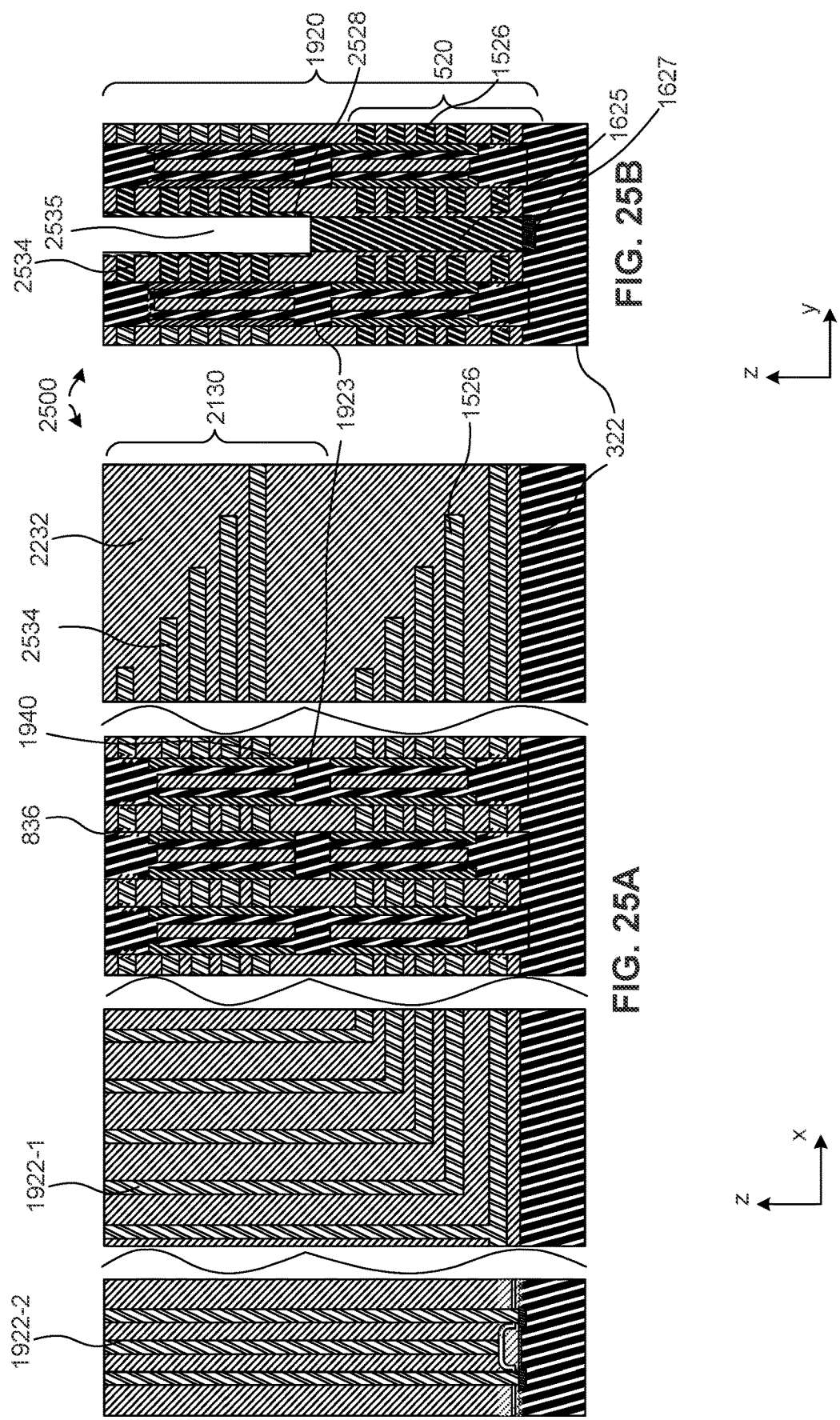

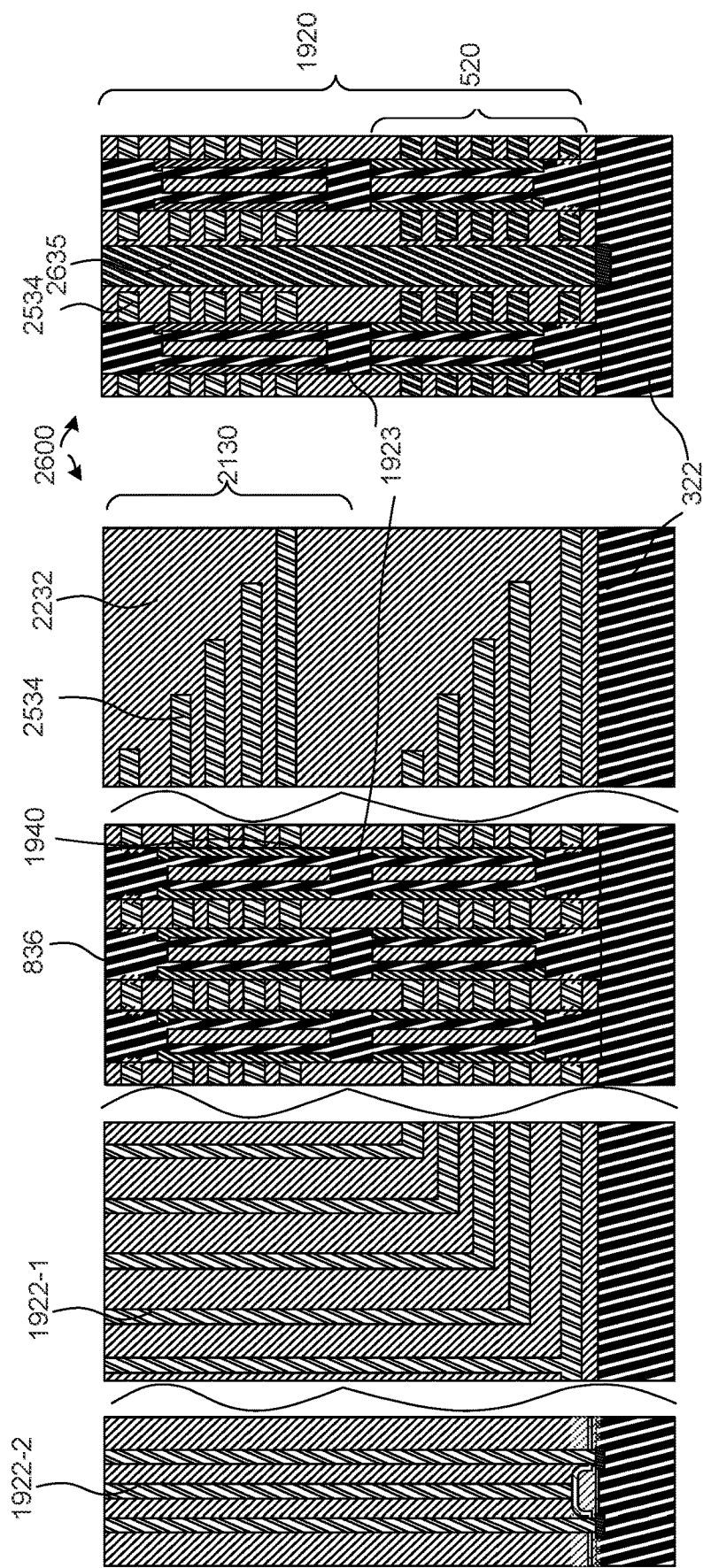

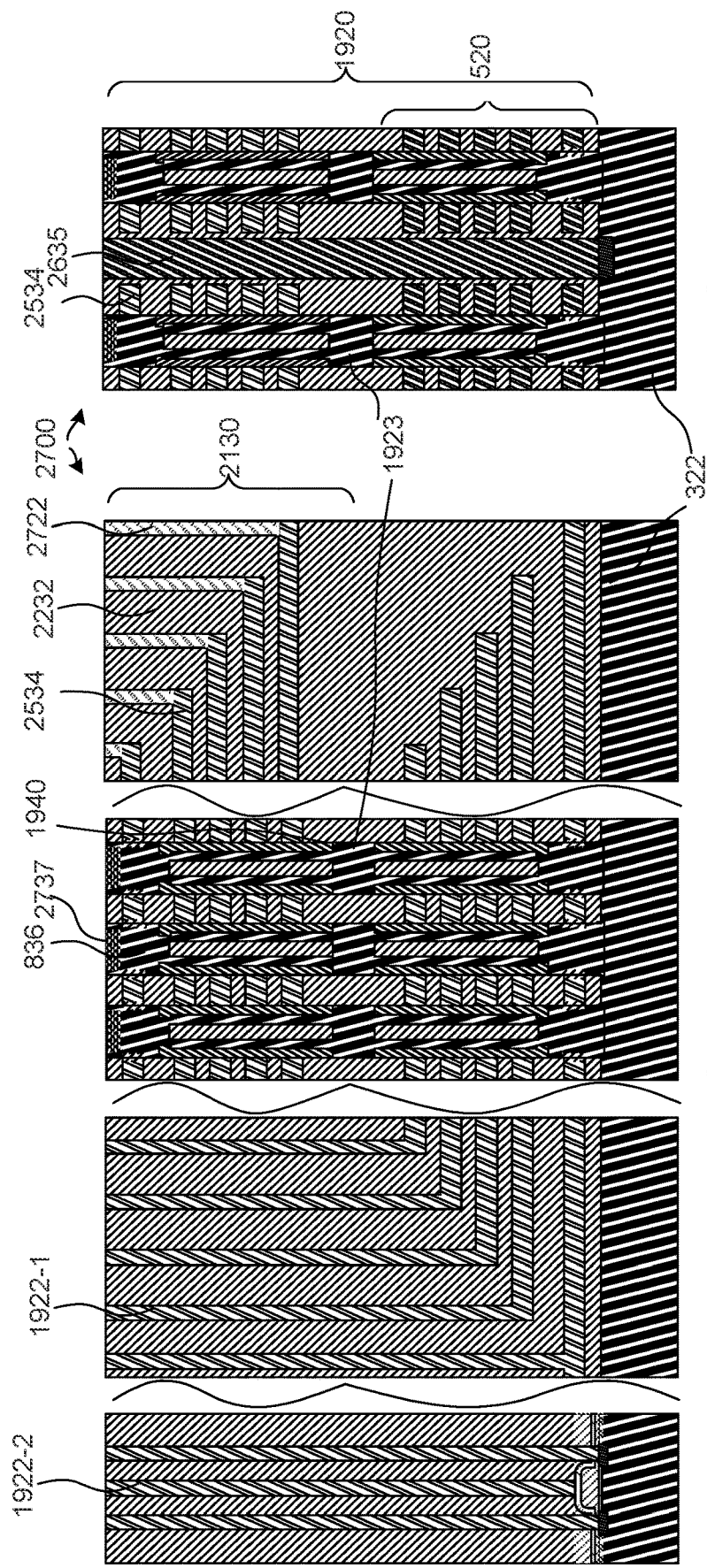
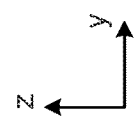
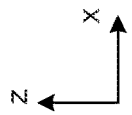

THREE-DIMENSIONAL MEMORY DEVICE AND FABRICATION METHOD THEREOF

CROSS-REFERENCE TO RELATED APPLICATIONS

This application is a divisional application of U.S. Patent application Ser. No. 16/220,017, filed on Dec. 14, 2018, which is a continuation application of International Application No. PCT/CN2018/114362, filed on Nov. 7, 2018, which claim priority to Chinese Patent Application No. 201711166877.8, filed on Nov. 21, 2017, all of which are incorporated herein by reference in their entireties.

BACKGROUND

Flash memory devices have undergone rapid development. Flash memory devices can store data for a considerably long time without powering, and have advantages such as high integration level, fast access, easy erasing, and rewriting. To further improve the bit density and reduce cost of flash memory devices, three-dimensional NAND flash memory devices have been developed.

A three-dimensional (3D) NAND memory device includes one or more stacks of word lines (or gate electrodes) arranged over a substrate, with a plurality of semiconductor channels, through and intersecting word lines, into the substrate. A stack of word lines includes word lines of different levels/tiers stacking along a direction perpendicular to the substrate, where a different level/tier represents a different height from the surface of the substrate.

A multiple-stack (or multiple-level) 3D NAND memory device often includes multiple stacks of staircase structures arranged along the direction perpendicular to the substrate. Each staircase structure includes a plurality of word lines arranged along the direction perpendicular to the substrate. Semiconductor channels extend through the word lines and into the substrate. This arrangement can have the advantages of, e.g., allowing more memory cells to be formed along the direction perpendicular to the substrate, reducing the number of photomasks during staircase formation, and avoiding substrate over etch during high aspect ratio etches. However, the fabrication process of multi-stack 3D NAND memory device needs to be improved.

BRIEF SUMMARY

Embodiments of three-dimensional memory device architectures and fabrication methods therefore are disclosed herein. The disclosed structures and methods provide numerous benefits, including, but not limited to simplifying the fabrication process, reducing the size of the three-dimensional memory device, and improving the space utility of the chip which the three-dimensional memory device is formed on.

In some embodiments, a method for forming a memory device includes the following operations. First, a plurality of first semiconductor channels can be formed over a first wafer with a peripheral device and a plurality of first via structures neighboring the plurality of first semiconductor channels. The plurality of first semiconductor channels can extend along a direction perpendicular to a surface of the first wafer. Further, a plurality of second semiconductor channels can be formed over a second wafer with a plurality of second via structures neighboring the plurality of second semiconductor channels. The plurality of second semiconductor channels can extend along a direction perpendicular to a surface of the second wafer and a peripheral via structure. Further, the first wafer and the second wafer can be bonded to adjoin each one of the plurality of first semiconductor channels with a corresponding one of the plurality of second semiconductor channels along the direction perpendicular to the surface of the first wafer to form a plurality of adjoined semiconductor channels In some embodiments, forming the plurality of first semiconductor channels includes forming a first staircase structure over the first wafer, forming a first dielectric fill structure over the first staircase structure, and forming the plurality of first semiconductor channels in the first staircase structure. In some embodiments, forming the plurality of second semiconductor channels includes forming a second dielectric stack over the second wafer, forming a second dielectric fill structure over the second dielectric stack, and forming the plurality of second semiconductor channels in the second dielectric stack.

In some embodiments, forming the first staircase structure includes forming a first dielectric stack of a plurality of sacrificial material layers and a plurality of insulating material layers alternatingly stacking along the direction perpendicular to the surface of the first wafer, etching the plurality of sacrificial material layers and the plurality of insulating material layers along the direction perpendicular to the surface of the first wafer to form a plurality of staircases. Each staircase can include a sacrificial layer and an insulating layer. In some embodiments, forming the second dielectric stack includes forming a plurality of other sacrificial material layers and a plurality of other insulating material layers along the direction perpendicular to the surface of the second wafer.

In some embodiments, forming the plurality of first semiconductor channels in the first staircase structure includes forming a plurality of first channel holes in the first staircase structure to expose the first wafer, forming a doped epitaxial layer in the plurality of first channel holes over the first wafer, and filling each one of the plurality of first channel holes with a channel-forming layer. In some embodiments, forming the plurality of second semiconductor channels in the second dielectric stack includes forming a plurality of second channel holes in the second dielectric stack to expose the second wafer, forming another doped epitaxial layer in the plurality of second channel holes over the second wafer, and filling each one of the plurality of second channel holes with another channel-forming layer.

In some embodiments, forming the doped epitaxial layer includes depositing a doped semiconductor material layer in the plurality of first channel holes. A top surface of the doped semiconductor layer can be positioned between a first sacrificial layer and a second sacrificial layer from a bottom of the first staircase structure. In some embodiments, forming the other doped epitaxial layer includes depositing another doped semiconductor material in the plurality of second channel holes. A top surface of the other doped semiconductor layer can be positioned between a first sacrificial material layer and a second sacrificial material from a bottom of the second dielectric stack.

In some embodiments, filling each one of the plurality of first channel holes with the channel-forming layer and filling each one of the plurality of second channel holes with the other channel-forming layer respectively includes forming a memory layer in each one of the plurality of first channel holes and the plurality of second channel holes, forming a tunneling dielectric layer over the memory layer in each one of the plurality of first channel holes and the plurality of second channel holes, and etching a portion of the memory layer and the tunneling dielectric layer to expose the doped epitaxial layer in each one of the plurality of first channel holes and to expose the other doped epitaxial layer in each one of the plurality of second channel holes. Filling each one of the plurality of first channel holes with the channel-forming layer and filling each one of the plurality of second channel holes with the other channel-forming layer respectively also includes forming a semiconductor channel layer over an etched tunneling dielectric layer and an etched memory layer in each one of the plurality of first channel holes and the plurality of second channel holes and forming a dielectric core layer over the semiconductor channel layer in each one of the plurality of first channel holes and the plurality of second channel holes to fill in the plurality of first channel holes and the plurality of second channel holes.

In some embodiments, forming the memory layer comprises depositing a doped polysilicon layer over a sidewall of each one of the plurality of first channel holes and the plurality of second channel holes, forming the tunneling dielectric layer comprises sequentially forming a silicon oxide layer, a silicon nitride layer, and another silicon oxide layer over the memory layer, forming the semiconductor channel layer comprises forming a polysilicon layer over the etched tunneling dielectric layer and the etched memory layer, and forming the dielectric core layer comprises forming a silicon oxide layer over the semiconductor channel layer.

In some embodiments, the method further includes planarizing a top surface of each one of the channel-forming layer and the other channel-forming layer and forming a dielectric cap layer over a planarized top surface of the channel-forming layer and a planarized top surface of the other channel-forming layer.

In some embodiments, the method further includes forming a recess region in the dielectric cap layer over each one of the planarized top surface of the channel-forming layer and the planarized top surface of the other channel-forming layer to expose at least the semiconductor channel layer, forming a connection material layer in the recess region, and planarizing a top surface of the connection material layer to form a first connection layer over the channel-forming layer and a second connection layer over the other channel-forming layer.

In some embodiments, the method further includes forming a first gate line slit (GLS) trench between adjacent first semiconductor channels along a direction the plurality of insulating layers and the plurality of sacrificial layers extend and forming a second GLS trench between adjacent second semiconductor channels along a direction the plurality of other insulating material layers and the plurality of other sacrificial material layers extend.

In some embodiments, forming the first GLS trench includes etching a portion of the first staircase structure along the direction the plurality of insulating layers and the plurality of sacrificial layers extend to expose the first wafer, and forming the second GLS trench includes etching a portion of the second dielectric stack along the direction the plurality of other insulating materials and the plurality of other sacrificial material layers extend to expose the second wafer.

In some embodiments, the method further includes removing the plurality of sacrificial layers to form a plurality of first electrode-forming tunnels connected with the first GLS trench, forming a GLS fill structure in the second GLS trench, and planarizing the GLS fill structure.

In some embodiments, the method further includes forming a plurality of first electrode-forming layers in the plurality of first electrode-forming tunnels and a first sacrificial source fill structure in the first GLS trench, removing the first sacrificial source fill structure to form and expose a plurality of gate electrodes and expose the first wafer, and forming a spacer material layer over the plurality of gate electrodes and the first wafer. In some embodiments, the method also includes removing a portion of the spacer material layer to form a spacer layer over the plurality of gate electrodes and a first source trench that exposes the first wafer, forming a source region in the first wafer at a bottom of the first source trench, forming a partial source via structure in the first source trench, and planarizing the partial source via structure.

In some embodiments, forming the plurality of electrode-forming layers, the first sacrificial source fill structure, and the partial source via structure include depositing tungsten into the first electrode-forming tunnels, the first GLS trench, and the first source trench, respectively, and forming the source region comprises performing an ion implantation process to implant ions of polarity opposite of the first wafer into a portion of the first wafer at the bottom of the first source trench.

In some embodiments, removing the portion of the spacer material layer includes performing an anisotropic etch to remove the portion of the spacer material layer along the direction perpendicular to the first wafer so a width of the first source trench is smaller than a width of the GLS fill structure.

In some embodiments, the method further includes forming a plurality of first via holes extending from a top surface of the first dielectric fill structure to the plurality of gate electrodes and the periphery device and forming a plurality of second via holes extending from a top surface of the second dielectric fill structure to the second wafer. A location of each one of the plurality of second via holes can correspond to a location of a different one of the plurality of first via holes.

In some embodiments, forming the plurality of first via holes extending from a top surface of the first dielectric fill structure to the plurality of gate electrodes and the periphery device includes removing portions of the first dielectric fill structure to form the plurality of first via holes extending from the top surface of the first dielectric fill structure to the plurality of gate electrodes, and to a source and drain region and a gate region of the peripheral device.

In some embodiments, the method further includes filling the plurality of first via holes and the plurality of second via holes with a via-forming material to respectively form the plurality of first via structures and the plurality of second via structures, and planarizing a top surface of the first wafer and a top surface of the second wafer to expose each one of the plurality of first via structures, each one of the plurality of second via structures, the first connection layer, the second connection layer, the GLS fill structure, and the first source fill structure.

In some embodiments, bonding the first wafer and the second wafer to adjoin each one of the plurality of first semiconductor channels with a corresponding one of the plurality of second semiconductor channels along the direction perpendicular to the surface of the first wafer to form a plurality of adjoined semiconductor channels includes performing a treatment on at least one of the top surface of the first wafer and the top surface of the second wafer, aligning each one of the plurality of first via structures on the top surface of the first wafer to a corresponding one of the plurality of second via structures on the top surface of the second wafer, and applying a hybrid bonding process to flip-chip bond the top surface of the first wafer and the top surface of the second wafer, such that each one of the plurality of first via structures is connected to the corresponding one of the plurality of second via structures to form a plurality of adjoined via structures, the first connection layer is connected to the second connection layer, and the partial source via structure is connected to the GLS fill structure along the direction perpendicular to the surface of the first wafer.

In some embodiments, the method further includes removing a top portion of the second wafer to expose the plurality of second via structures, the other doped epitaxial layer, and the GLS fill structure, etching the plurality of other sacrificial material layers and the plurality of other insulating material layers along the direction perpendicular to the surface of the second wafer to form a second staircase structure with a plurality of other staircases. Each other staircase can include another sacrificial layer and another insulating layer. The method can further include forming a third dielectric fill structure over the second staircase structure and planarizing the third dielectric fill structure.

In some embodiments, the method further includes removing the GLS fill structure to expose the partial source via structure, removing the plurality of other sacrificial layers to form a plurality of second electrode-forming tunnels connected with the second GLS trench, forming a third conductive material structure to fill in the second GLS trench and the plurality of second electrode-forming tunnels and form a plurality of second electrode-forming, layers connected to another source fill structure, and planarizing the third conductive material structure.

In some embodiments, the method further includes removing the other source fill structure to expose a sidewall and a bottom of the second GLS trench and to form a plurality of other gate electrodes, forming another spacer material layer over the sidewall and the bottom of the second GLS trench, and removing a portion of the other spacer material layer to form a second source trench that exposes the partial source via structure. In some embodiments, the method further includes filling the second source trench with another via-forming material, to connect the partial source via structure and form a source via structure in the first source trench and the second source trench and planarizing a top surface of the source via structure.

In some embodiments, the method further includes forming a plurality of third via holes extending from a top surface of the third dielectric fill structure to the plurality of other gate electrodes, filling the plurality of third via holes with a third via-forming material to form a plurality of third via structures, planarizing a top surface of each one of the plurality of third via structures, and performing an ion implantation process to dope the other epitaxial layer and form a contact region in the other epitaxial layer.

In some embodiments, a memory device includes a plurality of staircase structures stacked over a substrate along a direction perpendicular to a surface of the substrate. The plurality of staircase structures can be positioned in a dielectric fill structure over the substrate and each one of the plurality of staircase structures can include a plurality of gate electrodes separated by a plurality of insulating layers and extending along a direction parallel to the surface of the substrate. In some embodiments, the memory device also includes a semiconductor channel extending from a top surface of a first one of the plurality of staircase structures through the plurality of staircase structures into the substrate, a first portion of peripheral via structures extending through the dielectric fill structure and being connected to the plurality of gate electrodes of each one of the plurality of staircase structures, and a second portion of peripheral via structures extending through the dielectric fill structure and being connected to a peripheral device over the substrate and neighboring the plurality of staircase structures.

In some embodiments, the semiconductor channel comprises a plurality of semiconductor sub-channels, and each one of the plurality of semiconductor sub-channels is positioned in a different one of the plurality of staircase structures and is connected to one another by a connection layer between adjacent staircase structures.

In some embodiments, the connection layer comprises a doped polysilicon layer.

In some embodiments, the memory device further includes a source region in the substrate neighboring the semiconductor channel and a drain region at a top portion of the of the semiconductor channel. The drain region and the source region can each include a doped single crystalline silicon layer.

In some embodiments, a dopant polarity of the connection layer is same as a dopant polarity of the source region and the drain region.

In some embodiments, the first portion of peripheral via structures are connected to word line signals, and the second portion of peripheral via structures are connected to a source, a drain, and a gate of the peripheral device.

In some embodiments, the semiconductor channel comprises a memory layer, a tunneling dielectric layer over the memory layer, a semiconductor channel layer over the tunneling dielectric layer, and a dielectric core layer over the semiconductor channel layer.

In some embodiments, the memory layer includes a doped polysilicon layer, the tunneling dielectric layer includes a combination of a silicon oxide layer, a silicon nitride layer, and another silicon oxide layer, the semiconductor channel layer includes a polysilicon layer, and the dielectric core layer comprises a silicon oxide layer.

In some embodiments, the memory device further includes a first epitaxial semiconductor layer connected to the substrate at a bottom of the semiconductor channel. A top surface of the first epitaxial semiconductor layer can be positioned between a first gate electrode and a second gate electrode from the substrate. In some embodiments, the memory device also includes a second epitaxial semiconductor layer at a top of the semiconductor channel. A bottom surface of the second epitaxial semiconductor layer can be positioned between a first gate electrode and a second gate electrode from the top surface of the first one of the plurality of staircase structures.

In some embodiments, the memory device further includes a source via structure extending from the top surface of the first one of the plurality of staircase structures to the source region. The source via structure can be connected to a source line.

In some embodiments, the dielectric fill structure and the insulating layers include silicon oxide, and the gate electrode and the source via structure include tungsten.

In some embodiments, the memory device further includes a contact region over the drain region. The contact region can be connected to a bit line.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion. Multiple instances of an element may be duplicated where a single instance of the element is illustrated, unless absence of duplication of element is expressly described or clearly indicated otherwise.

FIGS. 3A-18A each illustrates a cross-sectional view of a base wafer along an A-A' direction at a different stage of an exemplary fabrication process, according to some embodiments of the present disclosure.

FIGS. 3B-18B each illustrates a cross-sectional view of a bonding wafer along an A-A' direction at a different stage of an exemplary fabrication process, according to some embodiments of the present disclosure.

FIGS. 12C-18C each illustrates a cross-sectional view of a base wafer along a B-B' direction at a different stage of an exemplary fabrication process, according to some embodiments of the present disclosure.

FIGS. 12D-18D each illustrates a cross-sectional view of a bonding wafer along a B-B' direction at a different stage of an exemplary fabrication process, according to some embodiments of the present disclosure.

FIGS. 19A-27A each illustrates a cross-sectional view of a bonded structure along an A-A' direction at a different stage of an exemplary fabrication process, according to some embodiments of the present disclosure.

FIGS. 19B-27B each illustrates a cross-sectional view of a bonded structure along an B-B' direction at a different stage of an exemplary fabrication process, according to some embodiments of the present disclosure.

DETAILED DESCRIPTION

Figure 1:
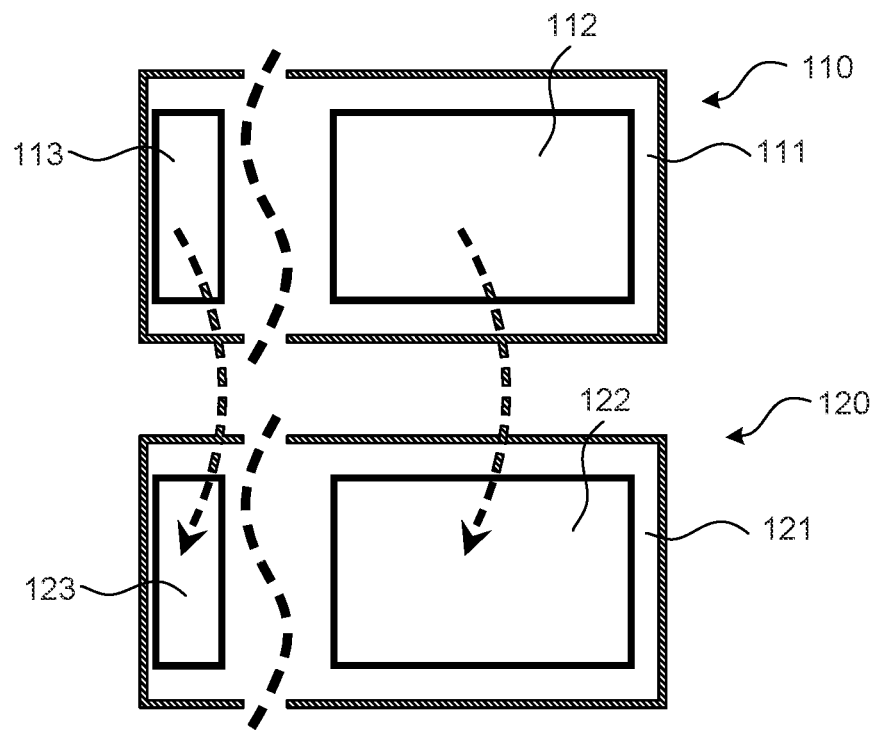
FIG. 1 illustrates a top view of a base wafer and a bonding wafer, according to some embodiments of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value.)

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a sacrificial layer and the underlying insulating layer can together be referred to as "a tier," a word line and the underlying insulating layer can together be referred to as "a tier," word lines of substantially the same height can be referred to as "a tier of word lines" or similar, and so on.

The trend in three-dimensional NAND memory industry includes the reduction of device dimensions and the simplification of fabrication process. In a multiple-stack 3D memory device, word lines (control gate electrodes) of multiple stacks are arranged along a direction perpendicular to the top surface of a substrate. A "stack" refers to a pile of objects, arranged along a designated direction. These word lines are arranged to form a multiple-stack staircase structure. Memory cells for storing data are embedded in stacks of word lines, and the semiconductor channels formed through the stacks of word lines. This configuration allows more memory cells to be formed within a unit area.

In the present disclosure, the terms "staircase structure," "stepped cavity structure," or similar refer to a structure having stepped surfaces. "Stepped surfaces" can refer to a set of surfaces that include at least two horizontal surfaces (e.g., along x-y plane) and at least two (e.g., first and second) vertical surfaces (e.g., along the z-axis) such that each horizontal surface is adjoined to a first vertical surface that extends upward from a first edge of the horizontal surface, and is adjoined to a second vertical surface that extends downward from a second edge of the horizontal surface. A "step" or "staircase" can refer to a vertical shift in the height of a set of adjoined surfaces.

A trend in 3D NAND memory device formation includes an increase in the number of memory cells formed along the direction perpendicular to the top surface of the substrate to increase storage capacity. Ways to form a 3D NAND memory device with an increased number of memory cells include increasing a number of gate electrodes (e.g., word lines) and/or increasing the lengths of semiconductor channels along the direction perpendicular to the top surface of the substrate.

To form an increased number of gate electrodes, an increased number of sacrificial layers and/or insulating layers can be formed, and the sacrificial layers can be replaced by layers of a conductive material to form the gate electrodes. The alternating and repetitive deposition of the increased number of sacrificial layers and the insulating layers can increase film stress amongst the sacrificial layers and the insulating layers, impairing film quality and causing potential wafer bowing. Precision of photolithography can be affected.

Also, to form semiconductor channels that extend from a top surface of the upper staircase structure into the substrate, channel holes extending from the top surface of the upper staircase structure into the substrate can be formed. The increased length of semiconductor channels can require longer channel holes to be formed. The formation of longer channel holes that extend from the top surface of the upper staircase structure into the substrate can result in channel holes of high aspect ratio (e.g., the ratio of the length to the bottom width of a channel hole) to be formed. A channel hole with a high aspect ratio can have a non-uniform shape (e.g., a decreasing width from the top to the bottom of the channel hole) and cause non-uniformities in the semiconductor channel subsequently formed. As a result, memory cells formed around the semiconductor channel can have non-uniform electrical properties.

The present disclosure provides a 3D memory device and a fabrication method that forms the 3D memory device. The 3D memory device can be formed by bonding two or more wafers (e.g., a base wafer and a bonding wafer). Each wafer can include a staircase structure (also called a dielectric stack) and a plurality of semiconductor sub-channels formed therein. Semiconductor channels of the 3D memory device can be formed by aligning and adjoining semiconductor sub-channels of the two or more substrates. Gate electrodes (e.g., word lines) of staircase structures under the upper staircase structure can be formed before the bonding process, and gate electrodes of the upper staircase structure can be formed after the bonding process. Peripheral devices, such as complementary metal oxide semiconductor (CMOS) transistors, can be formed over one or more of the wafers (e.g., the base wafer) before the bonding process. Via structures to connect the peripheral devices and other parts of the 3D memory device can be formed after the bonding process. The disclosed device and method can avoid the formation of an undesirably large number of sacrificial layers/insulating layers over a same substrate and avoid the formation of high aspect-ratio semiconductor channels. Accordingly, the fabrication of the 3D memory device can be simplified and the semiconductor channels can have higher uniformity.

FIG. 1 illustrates a top view of a base wafer 110 and a bonding wafer 120, according to some embodiments. Base wafer 110 and bonding wafer 120 can each include a substrate 111 and 121, which provides the fabrication base for the formation of other structures over substrates 111 and 121. Elements 112 and 122 are each a respective array region of base wafer 111 and bonding wafer 121. In some embodiments, semiconductor sub-channels can be formed in array regions 112 and 122. Elements 113 and 123 are each a respective periphery region of base wafer 111 and bonding wafer 121. Periphery devices such as CMOS transistors can be formed in periphery region 113 of base water 111, and via structures can be formed to extend through periphery regions 113 and 123. Periphery region 113 can neighbor array region 112, and periphery region 123 can neighbor array region 122. The arrows pointing from base wafer 111 to bonding wafer 121 represent the regions of the two substrates bonded together. In an example, array region 112 of base wafer 110 can be bonded with array region 122 of bonding wafer 120, and peripheral regions 113 of base wafer 110 can be bonded with array region 123 of bonding wafer 120.

For illustrative purposes, two substrates (e.g., a base wafer and a bonding wafer) are described in the present disclosure. In various embodiments, more than two substrates can be fabricated and bonded using the disclosed method. The number of substrates that are bonded to form a 3D memory device should not be limited by the embodiments of the present disclosure.

Figure 2:
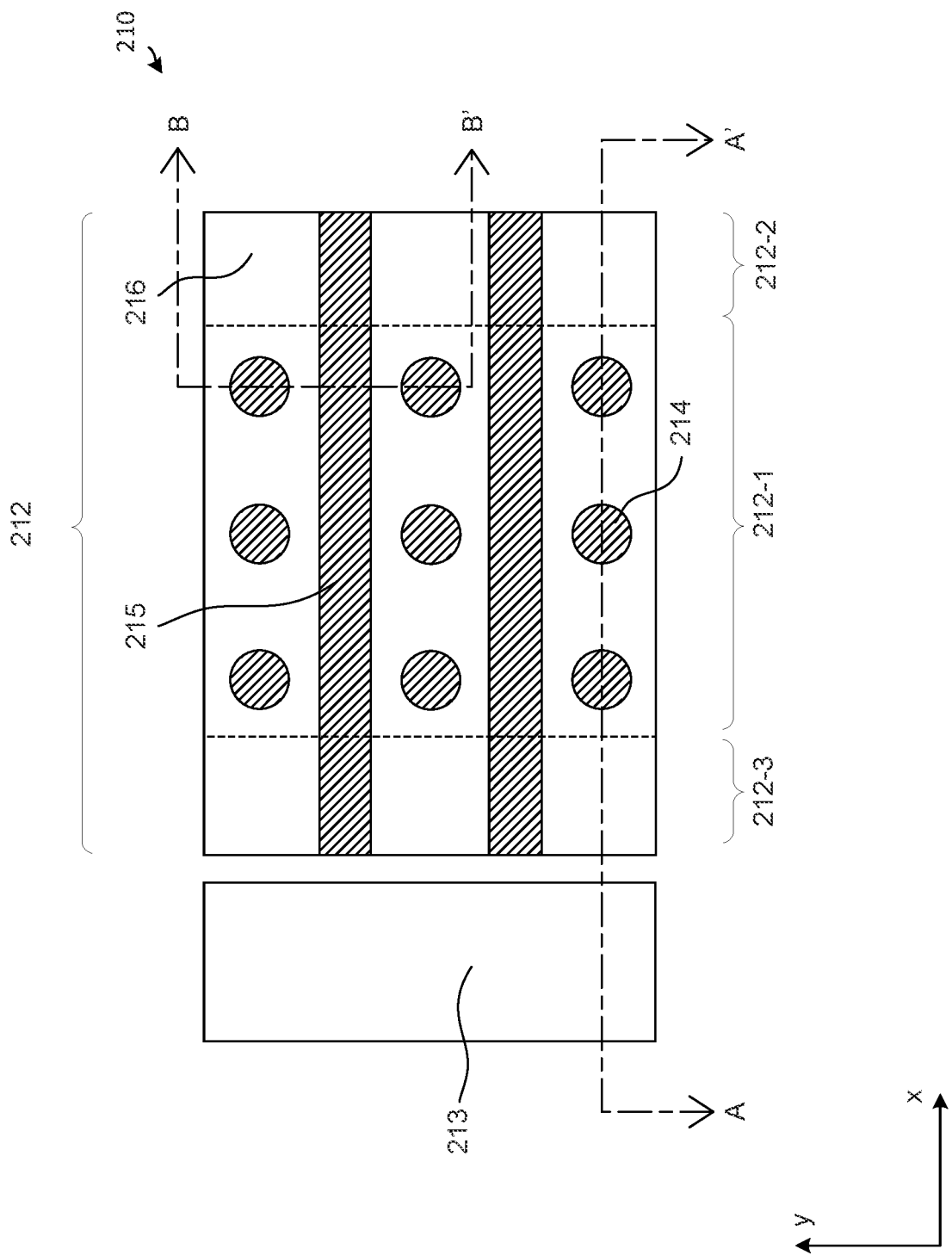
FIG. 2 illustrates a top view of different regions of a base wafer, a bonding wafer, and a bonded wafer, according to some embodiments of the present disclosure.

FIG. 2 illustrates a top view of a wafer 210. Wafer 210 can represent base wafer 110 and/or bonding wafer 120 of FIG. 1. Wafer 210 can also represent a bonded wafer formed by two or more waters (e.g., a base wafer and a bonding wafer).

Wafer 210 can be divided into an array region 212 and a peripheral region 213. Array region 212 can include a first staircase region 212-2, a second staircase region 212-3, and a channel region 212-1 between first staircase region 212-2 and second staircase region 212-3. Gate electrodes 216 can extend along the x axis in second staircase region 212-3, channel region 212-1, and first channel region 212-2. In some embodiments, staircases (not shown) are formed in first staircase region 212-2 and second staircase region 212-3, and semiconductor sub-channels 214 are formed in channel region 212-1. Source vias 215 can extend between semiconductor channels 214 along the x axis. For ease of description, structure and fabrication process of the disclosed 3D memory device are illustrated by employing cross-sectional views along the A-A' direction and B-B' direction. In the present disclosure, x axis and y axis represent directions parallel to the top surface of a wafer (e.g., a base wafer or a bonding wafer), and z axis represents a direction perpendicular to the top surface of the wafer. The terms of "horizontally" can be used interchangeably with "along the x axis," "along the y axis," or "along the x-y plane." The term of "vertically" can be used interchangeably with "along the z axis." For ease of description, other structures such as support pillars formed in the wafers (e.g., staircase structures of the wafers) are not shown or described in the present disclosure.

Figure 28A:
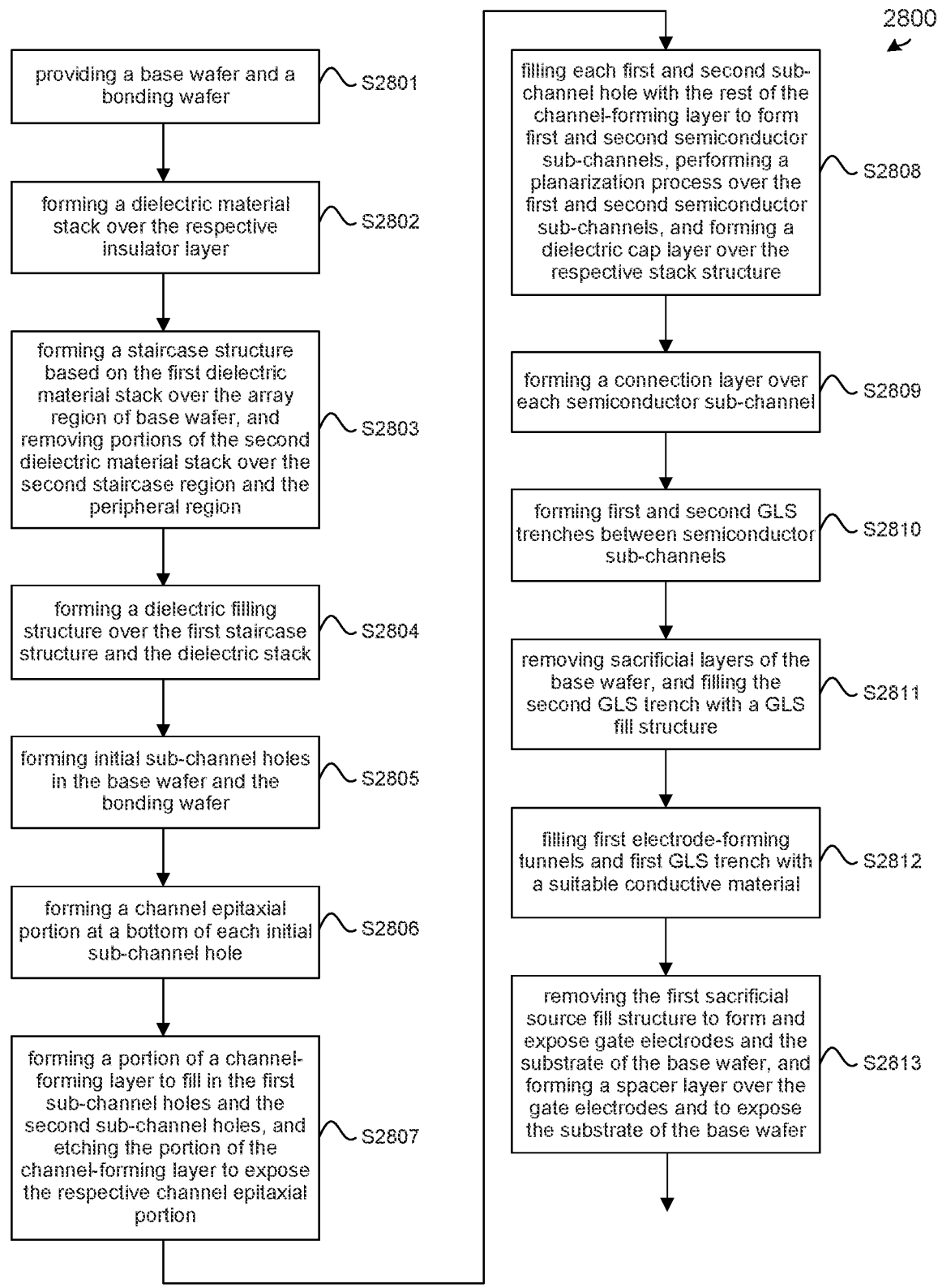
FIGS. 28A and 28B illustrate an exemplary fabrication process to form a 3D memory device, according to some embodiments.
Figure 28B:
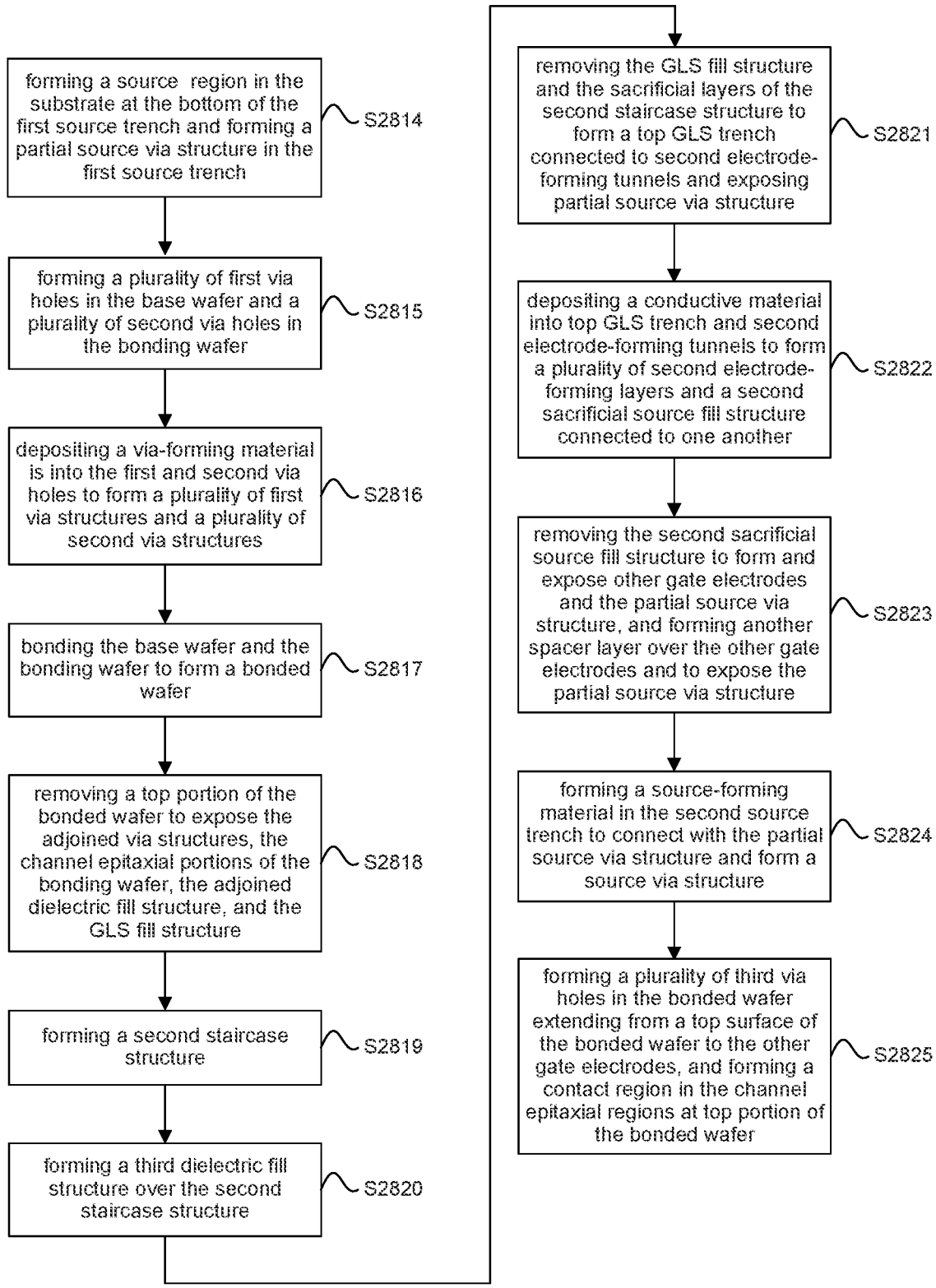

FIGS. 3A-18A and FIGS. 3B-18B illustrate exemplary structures of a base wafer and a bonding wafer (along the A-A' direction) at different stages of an exemplary fabrication process. FIGS. 12C-18C and FIGS. 12D-18D illustrate exemplary structures of a base wafer and a bonding wafer (along the B-B' direction) at different stages of an exemplary fabrication process. FIGS. 19A-27A and FIGS. 19B-27B illustrates exemplary structures of a bonded water (along the A-A' direction and along the B-B' direction) at different stages of an exemplary fabrication process. FIGS. 28A and 28B illustrate an exemplary fabrication process 2800 to form a 3D memory device, according to the embodiments of the present disclosure. The structure and fabrication process to form the 3D memory device is described in view of FIGS. 3-28 of the present disclosure.

Referring to FIG. 28A, at the beginning of the fabrication process, a base wafer and a bonding wafer can be provided (S2801). FIGS. 3A and 3B illustrate corresponding structures of base wafer 300 and bonding wafer 310.

As shown in FIGS. 3A and 3B, a base wafer 300 and a bonding wafer 310 can be provided. Base wafer 300 can include a substrate 322 and an insulator layer 321 over substrate 322. Base wafer 300 can also include one or more peripheral devices such as a transistor 324 (e.g., a CMOS transistor) over substrate 322 and covered by an insulator layer 321. Transistor 324 can have a source and drain electrode 323 in substrate 322 and a gate electrode at a top of transistor. Bonding wafer 310 can include a substrate 332 and an insulator layer 331 over substrate 332. Base wafer 300 and bonding wafer 310 can each be divided into an array region 212 and a peripheral region 213. Peripheral device 324 can be formed in peripheral region 213. A first portion of insulator layer 321-1 can be over array region 212 and a second portion of insulator layer 321-2 can be over peripheral region 213. A first portion of insulator layer 331-1 can be over array region 212 and a second portion of insulator layer 331-2 can be over peripheral region 213. In subsequent fabrication process, semiconductor channels can be formed in array regions 212, and via structures can be formed in array region 212 and peripheral regions 320-2 and 330-2. Array regions 212 include a channel region (e.g., the same as or similar to channel region 212-1), a first staircase region (e.g., the same as or similar to first staircase region 212-1), and a second staircase region (e.g., the same as or similar to second staircase region 212-2). First portions of insulator layers 321-1 and 331-1 can form gate insulator layers of respective stack. For ease of viewing, peripheral regions 213 and array regions 212 are not labeled in other figures of the present disclosure.

In some embodiments, substrates 322 and 332 each includes any suitable material for forming the three-dimensional memory device. For example, substrates 322 and 332 each can include silicon, silicon germanium, silicon carbide, silicon on insulator (SOI), germanium on insulator (GOI), glass, gallium nitride, gallium arsenide, and/or other suitable compound. Insulator layer 321 and 331 can include any suitable insulating material for providing proper insulation between different parts of the memory device. In some embodiments, insulator layer 321 and 331 include silicon oxide.

Referring to FIG. 28A, after the base wafer and the bonding wafer are provided, a dielectric material stack can be formed over the respective insulator layer (S2802). FIGS. 4A and 4B illustrate corresponding structures of base wafer 400 and bonding wafer 410.

As shown in FIGS. 4A and 4B, base wafer 400 can include a dielectric material stack 420 (e.g., first dielectric material stack 420) formed over insulator layer 321 (e.g., over first portion of insulator layer 321-1 and second portion of insulator layer 321-2), and bonding wafer 410 can include a dielectric material stack 430 (e.g., second dielectric material stack 430) formed over insulator layer 331 (e.g., over first portion of insulator layer 331-1 and second portion of insulator layer 331-2). First and second dielectric material stacks 420 and 430 can each include a plurality of alternatingly arranged sacrificial material layers and insulating material layers (e.g., one sacrificial material layer being positioned between two insulating material layers and vice versa) along a direction perpendicular to a surface of the respective substrate (e.g., along the z axis). In other words, first and second dielectric material stacks 420 and 430 can each include a plurality of dielectric pairs, each dielectric pair having a dielectric material layer and an insulating material layer. For example, elements 421 and 431 can represent insulating material layers, and elements 422 and 432 can include sacrificial material layers. For ease of illustration, a limited number of dielectric pairs (e.g., 5 pairs) are shown in the figures of the present disclosure to describe the structures. In various embodiments, first and second dielectric material stacks 420 and 430 can each include a desired number of dielectric pairs. For example, the number of dielectric pairs can be 32, 64, or 96. The specific number of dielectric material layers should not be limited by the embodiments of the present disclosure.

First and second dielectric material stacks 420 and 430 can each be formed by using any suitable deposition methods. For example, first and second dielectric material stack 420 can be formed over insulator layer 321 by alternatingly depositing insulating material layers 421 and sacrificial material layers 422. Sacrificial material layer 422 and insulating material layer 421 can have same or different thicknesses. Sacrificial material layer 422 can include any suitable material different from insulating material layer 421. In some embodiments, sacrificial material layer 422 can include poly-crystalline silicon, silicon nitride, poly-crystalline germanium, and/or poly-crystalline germanium-silicon. In some embodiments, sacrificial material layer 422 include silicon nitride. Insulating material layer 421 can include any suitable insulating materials, e.g., silicon oxide. The deposition of sacrificial material layers 422 and insulating material layers 421 can include any suitable deposition methods such as plasma-enhanced. CVD (PECVD), sputtering, atomic layer deposition (ALD), physical vapor deposition (PVD), and so on.

Figures 5A, 5B:
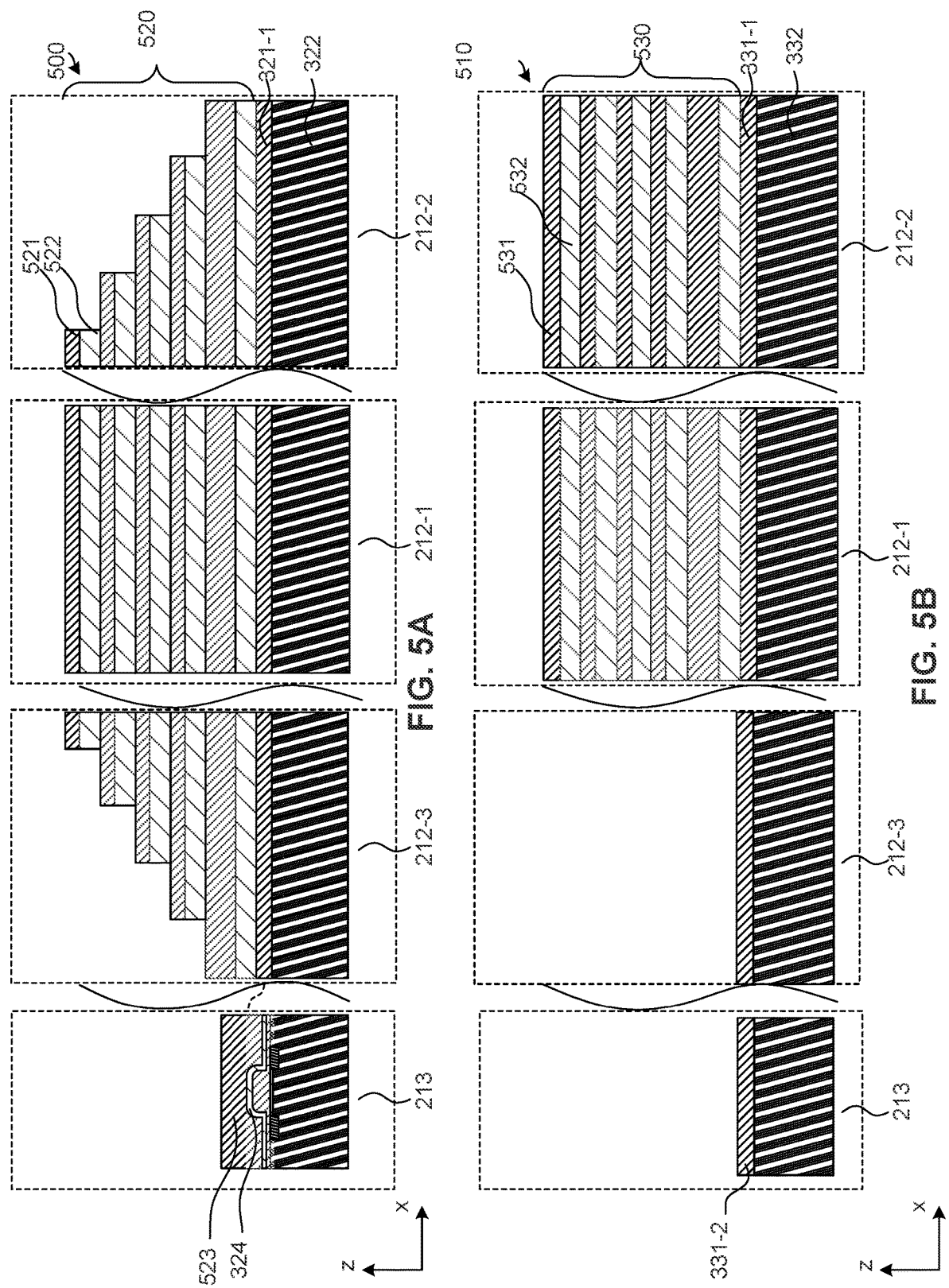

Referring to FIG. 28A, after dielectric material stacks are formed, a staircase structure can be formed based on the first dielectric material stack over the array region of base wafer, and portions of the second dielectric material stack over the second staircase region and the peripheral region can be removed (S2803). FIGS. 5A and 5B illustrate corresponding structures base wafer 500 and bonding wafer 510.

As shown in FIG. 5A, base wafer 500 can include a first staircase structure 520 formed over array region 212 (e.g., including channel region 212-1, first staircase region 212-2, and second staircase region 212-3), and a portion of first dielectric material stack 420 over peripheral region 213 can be removed. An insulator portion 523 can be retained in peripheral region 213 and over peripheral device 324. Insulator portion 523 can be formed from a remaining part of second portion of insulator layer 321-2.

First staircase structure 520 can be formed by repetitively patterning/etching, sacrificial material layers 422 and insulating material layers 421 of first dielectric stack 420 in array region 212 along the direction perpendicular to the surface of substrate 322 (e.g., along the z axis). Dielectric pairs of different tiers can be etched to form staircases extending along the x-y plane (e.g., y direction is perpendicular to the x-z plane). Each staircase can include an insulating layer (e.g., element 521) and a pairing sacrificial layer (e.g., element 522). Each sacrificial layer 522 can form a pair or a tier with an adjacent insulating layer over sacrificial layer 522 with substantially the same length/shape along the x axis. The etching of the sacrificial layer and the insulating layer in each pair can be performed in one etching process or different etching processes. In an exemplary etching process to form first staircase structure 520, a photoresist layer can be repetitively trimmed/etched along the x-y plane and employed as an etch mask for etching the staircases of first staircase structure 520. After the formation of the staircases/stepped surfaces, the etch mask can be removed, e.g., by asking. In some embodiments, multiple photoresist layers and/or multiple etching processes are employed to form the stepped surfaces. As an example shown in FIG. 5A, the insulating layer (e.g., element 521) of each tier is exposed. In various embodiments, in each pair/tier, sacrificial layer 522 is over insulating layer 521 and is exposed after the formation of the staircases. Any suitable etching methods (e.g., wet etch and/or dry etch) can be used to form first staircase structure 520. In some embodiments, sacrificial layers 522 include silicon nitride and insulating layers 521 include silicon oxide, and the etching of first dielectric stack 420 includes dry etch.

As shown in FIG. 5B, bonding wafer 510 can include dielectric stack 530 over channel region 212-1 and first staircase region 212-2. The portion of second dielectric stack 430 over peripheral region 213 and second staircase region 212-3 can be removed. The removal of the portion of second dielectric stack 430 over peripheral region 213 and second staircase region 212-3 can include any suitable etching methods (e.g., wet etch and/or dry etch). In some embodiments, insulator layer 331 (e.g., including first portion of insulator layer 331-1 and second portion of insulator layer 331-2) can be retained over substrate 332.

Referring to FIG. 28A, after the first staircase structure and the dielectric stack are formed, a dielectric filling structure is formed over the first staircase structure and the dielectric stack (S2804). FIGS. 6A and 6B illustrate corresponding structures of base water 600 and bonding wafer 610.

As shown in FIGS. 6A and 6B, a first dielectric filling structure 624 can be formed in array region 212 and peripheral region 213 of base wafer 600 so first staircase structure 520 is positioned in first dielectric filling structure 624. A second dielectric filling structure 634 can be formed in array region 212 and peripheral region 213 of bonding wafer 610 so dielectric stack 530 is positioned in second dielectric filling structure 634. First dielectric filing structure 624 and second dielectric filling structure 634 can each fill in the space formed by the removal of the respective dielectric materials.

First dielectric filling structure 624 and second dielectric filling structure 634 can each be formed by depositing a suitable dielectric filling material over the respective substrate. A suitable planarization method (e.g., chemical mechanical planarization (CMP) and/or recess etch) can be performed to remove any excessive dielectric filling material overlying the topmost surface of the respective first staircase structure 520/dielectric stack 530. The remaining, portion of the deposited dielectric filling material (e.g., over first staircase structure 520 and dielectric stack 530) can form dielectric filling structures 624 and 634, respectively. Dielectric filling structure 624 can be retro-stepped. In the present disclosure, a retro-stepped element refers to an element that has stepped surfaces and a horizontal cross-section area that increases monotonically as a function of a vertical distance from a top surface of a substrate on which the element is present. Dielectric filling structures 624 and 634 can include any suitable dielectric material that provides electrical insulation for the respective first staircase structure 520/dielectric stack 530, and can be deposited by any suitable deposition methods such as CVD, ALD, and/or PVD. In some embodiments, dielectric filling structures 624 and 634 include silicon oxide and are formed by CVD.

Referring to FIG. 28A, after the formation of the first and second dielectric filling structure, initial sub-channel holes can be formed in the base wafer and the bonding wafer (S2805). FIGS. 7A and 7B illustrate corresponding structures of base wafer 700 and bonding wafer 710.

As shown in FIGS. 7A and 7B, a plurality of first initial sub-channel holes 725 can be formed in channel region 212-1 of base wafer 700, and a plurality of second initial sub-channel holes 735 can be formed in channel region 212-1 of bonding wafer 710. In some embodiments, a location of each first initial sub-channel hole 725 corresponds to a different second initial sub-channel hole 735. Each one of first initial sub-channel holes 725 and second initial sub-channel holes 735 can intersect with the dielectric pairs of the respective stack structure and extend from a top surface of respective stack structure (e.g., first and second dielectric filling structure 624 and 634) and into the respective substrate (e.g., substrates 322 and 332).

First initial sub-channel holes 725 and second initial sub-channel holes 735 can be formed by similar or same etching methods. For example, first and second initial sub-channel holes 725 and 735 can be formed by, e.g., patterning a photoresist layer using photolithography over the respective stack structure (e.g., stack structures 620 and 630) to form openings in the patterned photoresist layer, and performing an etching process to remove the dielectric materials exposed by the openings. The locations of the openings can correspond to the locations of first and second initial sub-channel holes 725 and 735. The etching process can include any suitable wet etch and/or dry etch. In some embodiments, an anisotropic etch is performed to remove the dielectric materials vertically (e.g., along the z axis). In some embodiments, first and second initial sub-channel holes 725 and 735 can have a substantially rectangular cross-section shape along the x-z plane. In some embodiments, first and second initial sub-channel holes 725 and 735 can have a substantially trapezoidal cross-section shape along the x-z plane. In some embodiments, the horizontal dimension (e.g., along the x axis) of first and second initial sub-channel hole 725 and 735 can, e.g., decrease towards the substrate due to fabrication processes. Any variation of the shape of first and second initial sub-channel hole 725 and 735 is still within the scope of the present disclosure.

Referring to FIG. 7, after first and second initial sub-channel holes are formed, a channel epitaxial portion can be formed at a bottom of each initial sub-channel hole (S2806). FIGS. 8A and 8B illustrate corresponding structures of base water SOO and bonding wafer 810.

As shown in FIGS. 8A and 8B, a channel epitaxial portion 826 can be formed at the bottom of a first initial sub-channel hole 725, and a first sub-channel hole 825 can be formed. channel epitaxial portion 836 can be formed at the bottom of a second initial sub-channel hole 735, and a second sub-channel hole 835 can be formed. In some embodiments, a location of each first sub-channel hole 825 corresponds to a location of a different second sub-channel hole 835. The channel epitaxial portions (e.g., 826 and 836) can each be formed by a suitable deposition process. Channel epitaxial portions 826 and 836 can each function as a portion of a semiconductor channel.

Channel epitaxial portions 826 and 836 can be formed by any suitable deposition processes such as CVD, PVD, low temperature CVD (LPCVD), ALD, etc. In an example, a selective epitaxial deposition can be performed to epitaxially grow a semiconductor material on respective substrate (e.g., 322 and 332) at the bottom of first and second initial sub-channel holes 725 and 735. In some embodiments, channel epitaxial portions 826 and 836 each includes a single crystalline semiconductor in epitaxial alignment (e.g., same crystal orientation) respective substrate (e.g., 322 and 332.) In some embodiments, channel epitaxial portions 826 and 836 each includes single crystalline silicon. In some embodiments, a top surface of each one of channel epitaxial portions 826 and 836 can be between a first sacrificial layer (e.g., 827-1 or 937-1) from respective substrate (e.g., 322 or 332) and a second sacrificial layer (e.g., 827-2 or 937-2) from respective substrate (e.g., 322 or 332.)

Referring to FIG. 28A, after channel epitaxial portions are formed, a portion of a channel-forming layer can be formed to fill in the first sub-channel holes and the second sub-channel holes, and can be etched to expose the respective channel epitaxial portion (S2807). FIGS. 9A and 9B illustrate corresponding structures of base wafer 900 and bonding wafer 910.

As shown in FIG. 9A, the channel-forming layer can include a memory layer 927 over a sidewall of first sub-channel hole 825 and a tunneling dielectric layer 926 over memory layer 927. Memory layer 927 can trap charges and forming a plurality of charge storage regions vertically (e.g., along the z axis.) Tunneling dielectric layer 926 can be over and surrounded by the memory layer. Charge tunneling can be performed through the tunneling dielectric layer 926 under a suitable electric bias.

Memory layer 927 can be formed over the sidewall of first sub-channel hole 825. Memory layer 927 can include a charge trapping material, e.g., a dielectric charge trapping material (e.g., silicon nitride) and/or a conductive material (e.g., doped polysilicon). In some embodiments, the dielectric charge trapping material includes a multiple-layered structure of silicon oxide, silicon nitride, and silicon oxide, and can be formed by CVD, ALD, PVD, and/or other suitable deposition methods. Tunneling dielectric layer 926 can be sequentially formed over memory layer 927. Tunneling dielectric layer 926 can include silicon oxide, silicon nitride, silicon oxynitride, dielectric metal oxides, dielectric metal oxynitride, dielectric metal silicates, alloys, and/or other suitable materials. Tunneling dielectric layer 926 can be formed by CVD, ALD, PVD, and/or other suitable deposition methods. In some embodiments, tunneling dielectric layer 926 includes silicon oxide, and is formed by CVD.

Optionally, one or more block dielectric layers (not shown) can be formed over the sidewall of first sub-channel hole 825 before a formation of memory layer 927. The one or more block dielectric layers can include a first block layer, which includes a dielectric metal oxide layer with a relatively high dielectric constant. The term "metal oxide" can include a metallic element and non-metallic elements such as oxygen, nitrogen, and other suitable elements. For example, the dielectric metal oxide layer can include aluminum oxide, hafnium oxide, lanthanum oxide, yttrium oxide, tantalum oxide, silicates, nitrogen-doped compounds, alloys, etc. The first block layer can be deposited, for example, by CVD, ALD, pulsed laser deposition (PLD), liquid source misted chemical deposition, and/or other suitable deposition methods. The one or more block dielectric layers can also include a second block layer, which includes another dielectric layer over the dielectric metal oxide. The other dielectric layer can be different from the dielectric metal oxide layer. The other dielectric layer can include silicon oxide, a dielectric metal oxide having a different composition than the first block layer, silicon oxynitride, silicon nitride, and/or other suitable dielectric materials. The second block layer can be deposited, for example, by low pressure chemical vapor deposition (LPCVD), ALD, CVD, and/or other suitable deposition methods. In some embodiments, the one or more block dielectric layers include silicon oxide, which is formed by CVD.

Further, an etching process can be performed to remove a portion of memory layer 927 and tunneling dielectric layer 926 at the bottom of first sub-channel hole 825 to expose channel epitaxial portion 826. Any suitable etching process, e.g., dry etching and/or wet etch, can be employed to remove the portion of memory layer 927 and tunneling dielectric layer 926. In some embodiments, an anisotropic etch is performed to remove the portion of memory layer 927 and tunneling dielectric layer 926 at the bottom of first sub-channel hole 825.

The formation (e.g., deposition and etching) of memory layer 937 and tunneling dielectric layer 936 of bonding wafer 910, as shown in FIG. 9B, can be similar to or the same as memory layer 927 and tunneling dielectric layer 926 of FIG. 9A, and is not described herein.

Referring to FIG. 28A, after the formation of memory layer and tunneling dielectric layer, each first and second sub-channel hole can be filled with the rest of the channel-forming layer to form first and second semiconductor sub-channels, and a planarization process can be performed over the first and second semiconductor sub-channels. A dielectric cap layer can be formed over the respective stack structure (S2808). FIGS. 10A and 10B illustrate corresponding structures of base wafer 1000 and bonding wafer 1010.

As shown in FIG. 10A, the channel-forming layer can further include a semiconductor channel layer 1028 and a dielectric core 1029. In some embodiments, semiconductor channel layer 1028 can be formed over tunneling dielectric layer 926 in first sub-channel hole 825. Semiconductor channel layer 1028 can include one or more layers of any suitable semiconductor materials such as silicon, silicon germanium, germanium, III-V compound material, II-VI compound material, organic semiconductor material, and/or other suitable semiconductor materials. Semiconductor channel layer 1028 can be formed by a suitable deposition method such as metal-organic chemical vapor deposition (MOCVD), LPCVD, CVD, and/or other suitable deposition methods. In some embodiments, semiconductor channel layer 1028 is formed by depositing a layer of polycrystalline silicon.

Further, dielectric core 1029 can be formed by depositing a suitable dielectric material over semiconductor channel films to form first semiconductor sub-channels 1058. Dielectric core 1029 can fill in the space at the center of first sub-channel hole 825. Dielectric core 1029 can include a suitable dielectric material such as silicon oxide and/or organosilicate glass. Dielectric core 1029 can be formed by a suitable conformal deposition method (e.g., LPCVD) and/or self-planarizing deposition method (e.g., spin coating). In some embodiments, dielectric core 1029 includes silicon oxide and is formed by LPCVD. In some embodiments, a suitable planarization process (e.g., CMP and/or recess etch) is performed to remove any excessive materials over the top of channel-forming layer. In some embodiments, a dielectric cap layer 1024 is formed over the first staircase structure by any suitable deposition method, e.g., CVD.

Second semiconductor sub-channels 1068 can be formed after the deposition of semiconductor channel layer 1038 and dielectric core 1039, and a dielectric cap layer 1034 can be formed over second semiconductor sub-channels 1068. In some embodiments, a suitable planarization process (e.g., CMP and/or recess etch) is performed to planarize the top surface first semiconductor sub-channels 1058 and second semiconductor sub-channels 1068. The formation of semiconductor channel layer 1038 and dielectric core 1039 of bonding wafer 1010, and dielectric cap layer 1034, as shown in FIG. 10B, can be similar to or the same as semiconductor channel layer 1028, dielectric core of 1029, and dielectric cap layer 1024 of FIG. 10A, and are not described herein. In some embodiments, a location of each first semiconductor sub-channel 1058 corresponds to a location of a different second semiconductor sub-channel 1068.

Referring to FIG. 28A, after channel-forming layer is formed in first and second sub-channel holes, a connection layer can be formed over each semiconductor sub-channel (S2809). FIGS. 11A and 11B illustrate corresponding structures of base wafer 1100 and bonding wafer 1110.

As shown in FIG. 114, a first connection layer 1128 can be formed over first semiconductor sub-channel 1058. First connection layer 1128 can include a suitable semiconductor material such as polysilicon. In some embodiments, first connection layer 1128 includes doped polysilicon with conductivity type same as first semiconductor sub-channel 1058. First connection layer 1128 can be formed by any suitable methods such as ion implantation and/or deposition of the semiconductor material. In some embodiments, a recess etch (e.g., wet etch and/or dry etch) is performed to form a recess region in dielectric cap layer 1024 over first semiconductor sub-channel 1058. The recess region can expose semiconductor channel layer 1028 of first semiconductor sub-channel 1058. In some embodiments, a suitable deposition process (e.g., CVD) is performed to deposit a suitable semiconductor material (e.g., polysilicon) in the recess region. Any suitable doping process such as in-situ doping and/or ion implantation can be performed to dope first connection layer 1128 to a suitable doping concentration. The semiconductor material that forms first connection layer 1128 can be connected to semiconductor channel layer 1028. In some embodiments, a suitable planarization process (CMP and/or recess etch) is performed to planarize a top surface of first connection layer 1128. In some embodiments, a width d1 of first connection layer 1128 is at least the same as a width/diameter D1 of first semiconductor sub-channel 1128 along the x axis (or x-y plane). In some embodiments, d1 is greater than D1 along the x axis (or x-y plane).

The formation of second connection layer 1138 over second semiconductor sub-channel 1068 in dielectric cap layer 1034 of bonding water 1110, as shown in FIG. 11B, can be similar to or the same as second connection layer 1138 of FIG. 11A, and is not described herein. In some embodiments, a location of each first channel layer 1128 corresponds to a location of a different second channel layer 1138. In some embodiments, a width d2 of second connection layer 1138 is at least the same as a width/diameter D2 of second semiconductor sub-channel 1068 along the x axis (or x-y plane). In some embodiments, d2 is greater than D2 along the x axis (or x-y plane).

Referring to FIG. 28A, after the formation of first and second connection layers, first and second gate line slit (GLS) trenches can be formed between semiconductor sub-channels (S2810). FIGS. 12A and 12B illustrate cross-sectional views of corresponding structures of base wafer 1200 and bonding wafer 1210 along the x-z plane, and FIGS. 12C and 12D illustrate cross-sectional views of corresponding structures of base wafer 1200 and bonding wafer 1210 along the y-z plane.

As shown in FIGS. 12A-12D, first GLS trench 1225 can be formed between first semiconductor sub-channels 1058 along the y direction, and second GLS trench 1225 can be formed between second semiconductor sub-channels 1068 along the y direction. First GLS trench 1225 and second GLS trench 1235 can each expose respective substrate 322 an 332. First and second GLS trenches 1225 and 1235 can each be formed by a suitable etching process (e.g., dry etch and/or etch). In some embodiments, an anisotropic dry etch is performed to remove portions of base wafer 1200 and bonding wafer 1210 (e.g., the first staircase structure of base wafer 1200 and the dielectric stack of bonding wafer 1210) until substrates 322 and 332 are exposed. In some embodiments, insulating layers 521 and sacrificial layers 522 are exposed in (e.g., on the sidewall of) first GLS trench 1225, and insulating material layers 531 and sacrificial material layers 532 are exposed in (e.g., on the sidewall of) second GLS trench 1235.

Referring to FIG. 28A, after first and second GLS trenches are formed, sacrificial layers of the base wafer can be removed, and the second GLS trench can be filled with a GLS fill structure (S2811). FIGS. 13A and 13B illustrate cross-sectional views of corresponding structures of base wafer 1300 and bonding wafer 1310 along the x-z plane, and FIGS. 13C and 13D illustrate cross-sectional views of corresponding structures of base wafer 1300 and bonding wafer 1310 along the y-z plane.

As shown in FIGS. 13A and 13C, sacrificial layers 522 can be removed using a suitable isotropic etching process (e.g., wet etch and/or dry etch). First electrode-forming tunnels 1326 can be formed by the removal of sacrificial layers 522. First electrode-forming tunnels 1326 can extend horizontally (e.g., along the y direction) and be connected to first GLS trench 1225.

As shown in FIGS. 13B and 13C, second GLS trench 1235 can be filled with a GLS fill structure 1335. A suitable planarization process (e.g., CMP and/or recess etch) can be performed to remove any excessive material of GLS fill structure 1335 over a top of bonding wafer 1310. GLS fill structure 1335 can include any suitable structure of sufficient stiffness. In some embodiments, GLS fill structure 1335 includes polysilicon, which can be formed by any suitable deposition process such as CVD, PVD, ALD, and/or LPCVD.

Referring to FIG. 28A, after the formation of first electrode-forming tunnels and GLS fill structure, first electrode-forming tunnels and first GLS trench can be filled with a suitable conductive material (S2812). FIG. 14A illustrates a cross-sectional view of base wafer 1400 along the x-z plane, and FIG. 14C illustrates a cross-sectional view of base wafer 1400 along the y-z plane. In this step, no operation may be performed on bonding wafer 1310, and FIGS. 14B and 14D can be the same as FIGS. 13B and 13D, respectively.

As shown in FIGS. 14A and 14C, first electrode-forming tunnels 1325 and first GLS trench 1225 can be filled with a suitable first conductive material and a first conductive material structure 1424 can be formed in first electrode-forming tunnels 1325 and first GLS trench 1225. Specifically, a first sacrificial source fill structure 1425 can be formed in first GLS trench 1225, and a plurality of first electrode-forming layers 1426 can be formed in first electrode-forming tunnels 1325. First sacrificial source fill structure 1425 can be connected to the plurality of first electrode-forming layers 1426. The first conductive material can include any suitable material for forming the gate electrode of base wafer 1400 and can be deposited by any suitable deposition methods such as CVD, PVD, sputtering, e-beam PVD, etc. For example, the first conductive material can include one or more of tungsten, aluminum, cobalt, polysilicon, and copper. In some embodiments, the first conductive material includes tungsten and is deposited by CVD.

Referring to FIG. 28A, after the source fill structure and the first electrode-forming layers are formed, the first sacrificial source fill structure can be removed to form and expose gate electrodes and the substrate of the base wafer, and a spacer layer can be formed over the gate electrodes and to expose the substrate of the base wafer (S2813). FIG. 15A illustrates a cross-sectional view of base wafer 1500 along the x-z plane, and FIG. 15C illustrates a cross-sectional view of base wafer 1500 along the y-z plane. In this step, no operation may be performed on bonding wafer 1310, and FIGS. 15B and 15D can be the same as FIGS. 13B and 13D, respectively.

As shown in FIGS. 15A and 15C, first sacrificial source fill structure 1425 can be removed by a suitable etching process (e.g., dry etch and/or wet etch) and a plurality of gate electrodes 1526 can be formed from first electrode-forming layers 1426 after first electrode-forming layers 1426 are disconnected from first sacrificial source fill structure 1425. Gate electrodes 1526 can be exposed. In some embodiments, substrate 322 can be exposed. Further, a spacer material layer can be formed over the exposed gat electrodes 1526 and the exposed portion of substrate 322 resulted as the removal of first sacrificial source fill structure 1425 (e.g., over the plurality of gate electrodes 1526 and substrate 322). A suitable etching process (e.g., dry etch and/or wet etch) can be performed to remove the portion of the spacer material layer to expose substrate 322. A spacer layer 1528 can be formed over gate electrodes 1526 and a first source trench 1525 can be formed surrounded by spacer layer 1528 and substrate 322. In some embodiments, a width/diameter d3 of first source trench 1525 along the y axis (or a cross-sectional area of first source trench 1525 along the x-y plane) is less than a width/diameter d4 of GLS fill structure 1335 along they axis (or a cross-sectional area of GLS fill structure 1335 along the x-y plane).

The spacer material layer can include any suitable insulating material such as silicon oxide, and can be formed by any suitable deposition method such as CVD, PVD, ALD, etc. In some embodiments, the etching processes to remove first sacrificial source fill structure 1425 and the portion of the spacer material layer include an anisotropic dry etch that etches vertically (e.g., along the z axis).

Referring to FIG. 28B, after the formation of first source trench and the spacer layer in the base wafer, a source region can be formed in the substrate at a bottom of the first source trench and a partial source via structure can be formed in the first source trench (S2814). FIG. 16A illustrates a cross-sectional view of base wafer 1600 along the x-z plane, and FIG. 16C illustrates a cross-sectional view of base wafer 1600 along the y-z plane. In this step, no operation may be performed on bonding wafer 1310, and FIGS. 16B and 16D can be the same as FIGS. 13B and 13D, respectively.

As shown in FIGS. 16A and 16C, a source region 1627 can be formed at the bottom of first source trench 1525 in substrate 322, and a partial source via structure 1625 can be formed in first source trench 1525. In some embodiments, partial source via structure 1625 forms contact with source region 1627 and is insulated from gate electrodes 1526 by spacer layer 1528. Source region 1627 can be formed by any suitable method that forms dopants of a doping polarity opposite of a doping polarity of substrate 322. For example, source region 1627 can be formed by an ion implantation process that implants dopant of a doping polarity opposite of that of substrate 322 into substrate 322 and/or an epitaxial deposition process that epitaxially grows source region 1627 over substrate 322. In some embodiments, source region 1627 is formed by an ion implantation process. Partial source via structure 1625 can include any suitable source-forming material for forming a source contact/via and can be deposited by any suitable deposition methods such as CVD, PVD, sputtering, e-beam PVD, etc. For example, partial source via structure 1625 can include one or more of tungsten, aluminum, cobalt, polysilicon, and copper. In some embodiments, partial source via structure 1625 includes tungsten and is deposited by CVD. In some embodiments, a suitable planarization process (e.g., CMP and/or recess etch) is used to remove any excessive material at a top surface of partial source via structure 1625.

Referring to FIG. 28B, after the formation of partial source via structure and source region in the base wafer, a plurality of first via holes can be formed in the base wafer extending from a top surface of a first dielectric fill structure to the gate electrodes and peripheral device, and a plurality of second via holes can be formed in the bonding wafer extending from a top surface of a second dielectric fill structure to the substrate (S2815). FIGS. 17A and 17B illustrate cross-sectional views of corresponding structures of base wafer 1700 and bonding wafer 1710 along the x-z plane, and FIGS. 17C and 17D illustrate cross-sectional views of corresponding structures of base wafer 1700 and bonding wafer 1710 along the v-z plane.

As shown in FIGS. 17A-17D, a plurality of first via holes 1722 can be formed in a first dielectric fill structure 624 of base wafer 1710, and a plurality of second via holes 1732 can be formed in a second dielectric fill structure 634. In some embodiments, a first portion of first via holes 1722-1 is formed in second staircase region 212-3 and a second portion of first via holes 1722-2 is formed in peripheral region 213. In some embodiments, a first portion of second via holes 1732-1 is formed in second staircase region 212-3 and a second portion of second via holes 1732-2 is formed in peripheral region 213.

First portion of first via holes 1722-2 can extend from the top surface of first dielectric fill structure 624 to gate electrodes 1526 of base wafer 1700 and second portion of first via holes 1722-2 can extend from the top surface of first dielectric fill structure 624 to peripheral device 324. In some embodiments, at least one of first portion of first via holes 1722-1 is connected to one gate electrode 1526. In some embodiments, at least one of second portion of first via holes 1722-2 is connected to each one of a source electrode, a drain electrode, and a gate electrode of peripheral device 324. In some embodiments, first and second portion of second via holes 1732 (e.g., 1732-1 and 1732-2) extend from the top surface of second dielectric fill structure 634 into substrate 332 in second staircase region 212-3 and peripheral region 213. In some embodiments, a location of each one of second via holes 1732 corresponds to a location of a different one of first via holes 1722.

First and second via holes 1722 and 1.732 can be formed by any suitable methods. For example, a suitable etching process (e.g., dry etch and/or wet etch) can be performed to remove portions of first and second dielectric fill structures 624 and 634 to form first and second via holes 1722 and 1732. In some embodiments, an anisotropic dry etching process is performed for the formation of first and second via holes 1722 and 1732.

Figure 18A:
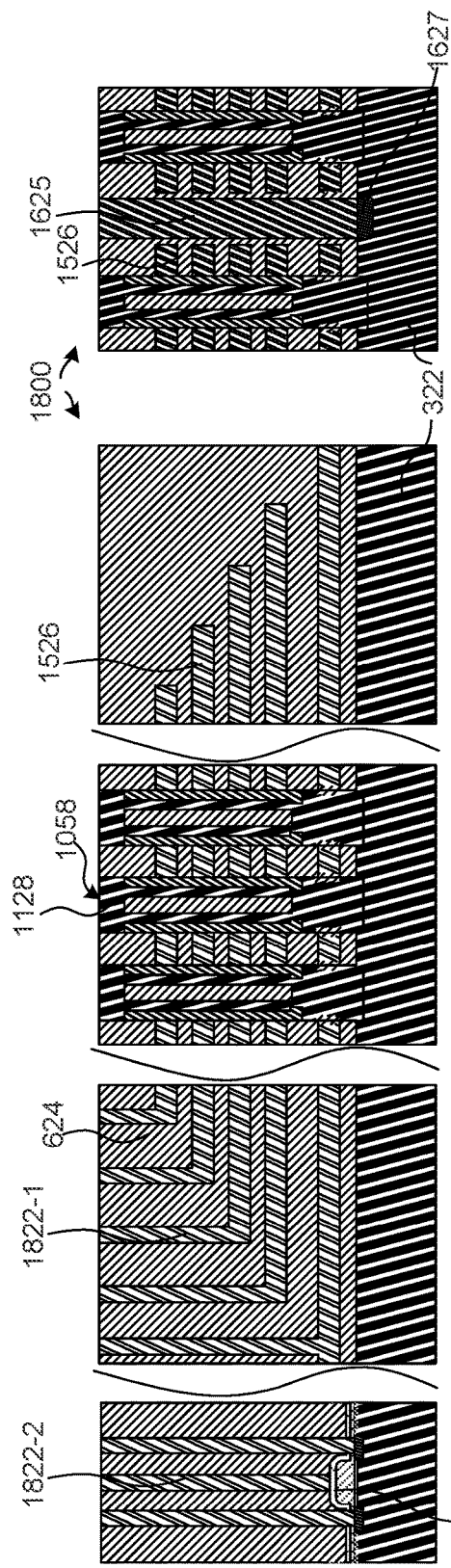
Figure 18B:

Referring to FIG. 28B, after the formation of first and second via holes, a via-forming material is deposited into the first and second via holes to form a plurality of first via structures and a plurality of second via structures (S2816). FIGS. 18A and 18B illustrate cross-sectional views of corresponding structures of base wafer 1800 and bonding wafer 1810 along the x-z plane, and FIGS. 18C and 18D illustrate cross-sectional views of corresponding structures of base wafer 1800 and bonding wafer 1810 along the y-z plane.

Figure 18C:
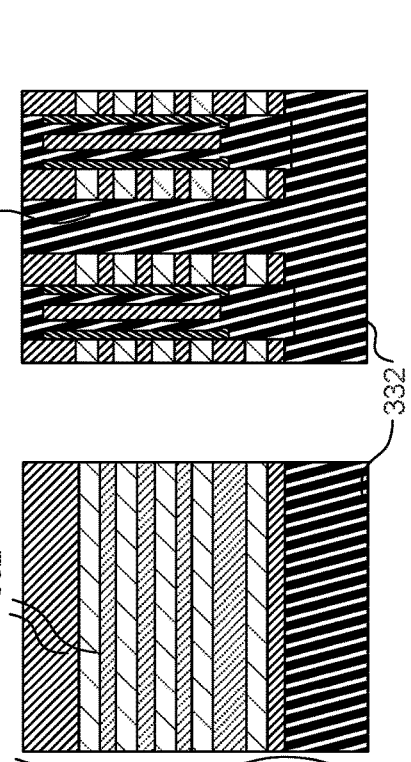
Figure 18D:

As shown in FIGS. 18A and 18C, a via-forming material can be deposited into first via holes 1722 and second via holes 1732 to form a plurality of first via structures 1822 and a plurality of second via structures 1832. In some embodiments, first via structures 1822 includes a first portion of first via structures 1822-1 (formed from first via holes 1722-1 in second staircase region 212-3) extending from the top surface of first dielectric fill structure 624 to gate electrodes 1526, and a second portion of first via structures 1822-2. (formed from first via holes 1722-2 in peripheral region 213) extending from the top surface of first dielectric fill structure 624 to peripheral device 324. In some embodiment, the second portion of first via structures 1822-2 are connected to the source electrode, the drain electrode, and the gate electrode of peripheral device 324. In some embodiments, second via structures 1832 includes a first portion of second via structures 1832-1 (formed from second via holes 1822-1 in second staircase region 212-3) extending from the top surface of second dielectric fill structure 634 to substrate 332, and a second portion of second via structures 1832-2 (formed from second via holes 1732-2 in peripheral region 213) extending from the top surface of second fill structure 634 to substrate 332. In some embodiments, the location of each first via structure 1822-1 of second staircase region 212-3 corresponds to the location of a different second via structure 1832-1 of second staircase region 212-3, and the location of each first via structure 1822-2 of peripheral region 213 corresponds to the location of a different second via structure 1832-2 of peripheral region 213.

The via-forming material can include any suitable material for forming first and second via structures 1822 and 1832, and can be deposited by any suitable deposition methods such as CVD, PVD, sputtering, e-beam PVD, etc. For example, the via-forming material can include a conductive material such as one or more of tungsten, aluminum, cobalt, polysilicon, and copper. In some embodiments, the via-forming material includes tungsten and is deposited by CVD. In some embodiments, a suitable planarization process (e.g., (IMP and/or recess etch) is used to remove excessive via-forming material over first via structures 1822 and/or second via structures 1832. In some embodiments, the planarization process is performed over a top surface of base wafer 1800 and a top surface of bonding wafer 1810 so each one of the plurality of first via structures 1822, each one of the plurality of second via structures 1832, each one of first connection layers 1128, each one of second connection layers 1138, GLS fill structure 1335, and first source fill structure 1625 are exposed. In some embodiments, a top surface of first via structure 1822 and/or a top surface of second via structure 1832 are each coplanar with a top surface of the respective dielectric fill structure (e.g., 624 and 634).

Referring to FIG. 28B, after the formation of first and second via structures and the planarization of base wafer and bonding wafer, the base wafer and the bonding wafer can be bonded to form a bonded wafer (S2817). FIG. 19A illustrates a cross-sectional view of corresponding structure of bonded wafer 1900 along the x-z plane, and MG. 19B illustrates a cross-sectional view of bonded wafer 1900 along the y-z plane.

As shown in FIGS. 19A and 19B, base wafer 1800 and bonding wafer 1810 can be bonded to form a bonded wafer 1900. In some embodiments, the top surface of base wafer 1800 can form flip-chip bonding with the top surface of bonding wafer 1810 so that each first connection layer 1128 is bonded with a corresponding second connection layer 1138. In some embodiments, each first semiconductor sub-channel 1058 is aligned to adjoin a corresponding second semiconductor sub-channel 1068 so that first semiconductor sub-channel 1058 and the corresponding/adjoining second semiconductor sub-channel 1068 are at least substantially aligned along the z axis. Accordingly, memory layer 927, tunneling dielectric layer 926, semiconductor channel layer 1028, and dielectric core 1029 of base wafer 1800 can be at least substantially aligned with memory layer 937, tunneling dielectric layer 936, semiconductor channel layer 1038, and dielectric core 1039 of bonding wafer 1810 along the z axis. The bonded first connection layer 1128 and second connection layer 1138 can form an adjoined connection layer 1923 (e.g., a common source of the 3D memory device), and the bonded first semiconductor sub-channel 1058 and second semiconductor sub-channel 1068 can form an adjoined semiconductor channel 1940.

By aligning and adjoining first and second semiconductor sub-channels (e.g., 1058 and 1068), each first via structure 1822 can be aligned with and adjoining a corresponding second via structure 1832 (e.g., first via structures 1822-1 aligned with and adjoining second via structures 1832-1, and first via structures 1822-2 aligned with and adjoining second via structures 1832-2) so adjoined via structures 1922 can be formed. Specifically, adjoined via structures 1922 can include a first portion of adjoined via structures 1922-1 in second staircase region 212-3 and a second portion of adjoined via structures 1922-2 in peripheral region 213. In some embodiments, first portion of adjoined via structures 1922-1 connect gate electrodes 1526 to metal contacts for applying gate voltages, and second portion of adjoined via structures 1922-2 connect the source electrode, drain electrode, and gate electrode of peripheral device 324 to metal contacts for applying control signals/voltages.

In some embodiments, GLS fill structure 1335 is at least substantially aligned with and adjoining partial source via structure 1625. In some embodiments, a width/diameter d3 of partial source via structure 1625 along the y axis (or a cross-sectional area of first source trench 1525 along the x-y plane) is less than a width/diameter d4 of GLS fill structure 1335 along the y axis (or a cross-sectional area of GLS fill structure 1525 along the x-y plane), and a projection of GLS fill structure 1335 over substrate 322 at least substantially overlaps with a projection of partial source via structure 1625 over substrate 322. In some embodiments, the projection of GLS fill structure 1335 over substrate 322 substantially covers the projection of partial source via structure 1625 over substrate 322. In some embodiments, first dielectric fill structure 624 is bonded with second dielectric fill structure 634 to form adjoined dielectric fill structure 1934.

In some embodiments, base wafer 1800 and bonding wafer 1800 to form a multiple-stack structure 1920 that includes the first staircase structure and dielectric stack of base wafer 1800 and bonding wafer 1810. The bonding process can include a hybrid bonding. Hybrid bonding (also known as "metal/dielectric hybrid bonding") can be a direct bonding technology (e.g., forming bonding between surfaces without using intermediate layers, such as solder or adhesives), which obtains metal-metal bonding and dielectric-dielectric bonding simultaneously. As illustrated in FIGS. 19A and 19B, each first connection layer 1128 is in contact with the corresponding second connection 1138, first dielectric fill structure 624 is in contact with second dielectric fill structure 1034, each first via structure 1822 is in contact with corresponding second via structure 1832, and so on. That is, a bonding interface 1929 can be formed between the top surface of base wafer 1800 and the top surface of bonding wafer 1810.

Any suitable treatment processes can be performed to facilitate/enhance the bonding between base wafer 1800 and bonding wafer 1810. In some embodiments, a treatment process is performed to the top surface of base wafer 1800 and the top surface of bonding wafer 1810 to enhance the bonding strength of the bonded top surfaces. For example, the treatment process can include a plasma treatment to treat the top surfaces of base wafer 1800 and bonding wafer 1810 so that chemical bonds can be formed between the top surfaces of base wafer 1800 and bonding wafer 1810. As another example, the treatment process can further include a wet process that treats the top surfaces of base wafer 1800 and bonding wafer 1810 so that the dielectric materials (e.g., first dielectric fill structure 624 and second dielectric fill structure 1034) can form desirable chemical bonds to enhance the bonding strength in between. As yet another example, the treatment process can further include a thermal process that can be performed at a temperature from about, e.g., 250° C. to about 600° C. The thermal process can cause inter-diffusion between conductive layers. As a result, the conductive layers (e.g., first connection layers 1128 and second connection layers 1138) can be inter-mixed with each other after the bonding process. In another example, bonding wafer 1810 can be pressed against base wafer 1800 to improve/enhance the contact between adjoining surfaces/parts between bonding water 1810 and base wafer 1800.

Figures 20A, 20B:
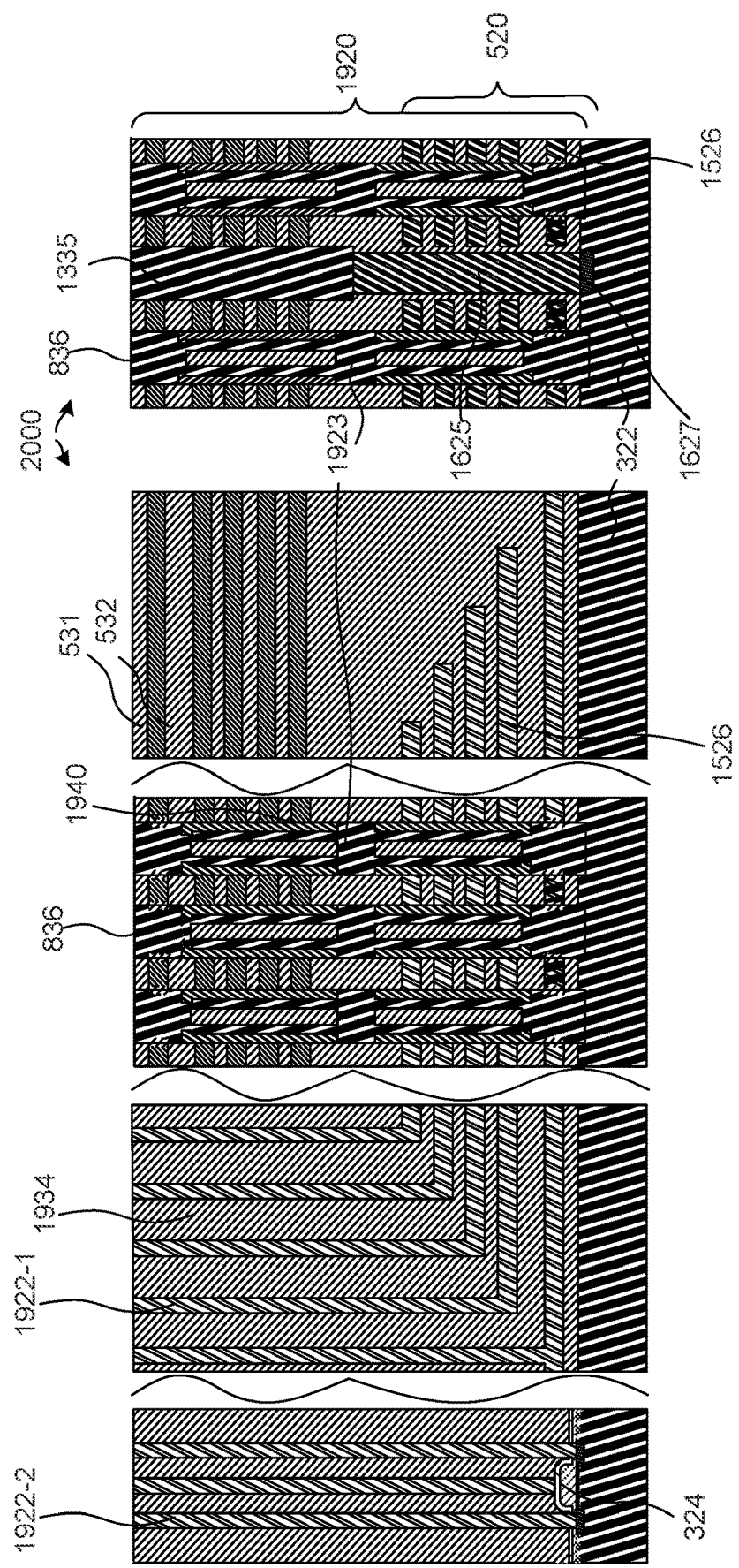

Referring to FIG. 28B, after the base wafer and the bonding wafer are bonded, a top portion of the bonded wafer can be removed to expose the adjoined via structures, the channel epitaxial portions of the bonding wafer, the adjoined dielectric fill structure, and the GLS fill structure (S2818). FIG. 20A illustrates a cross-sectional view of corresponding structure of bonded wafer 2000 along the x-z plane, and FIG. 20B illustrates a cross-sectional view of bonded wafer 2000 along the y-z plane.

As shown in FIGS. 20A and 20B, a top portion of bonded wafer 2000 can be removed to expose adjoined via structures 1922 (e.g., 1922-1 and 1922-2), channel epitaxial portions 836 of the bonding wafer, adjoined dielectric fill structure 1934, and GLS fill structure 1335. In some embodiments, substrate 332 of bonded wafer 1830 is at the top portion of bonded wafer 2000 and is removed by a suitable process. For example, a suitable CMP process and/or a recess etch can be performed to remove the top portion of bonded wafer 2000.

Referring to FIG. 28B, after the top portion of the bonded wafer is removed, a second staircase structure can be formed (S2819). FIG. 21A illustrates a cross-sectional view of corresponding structure of bonded wafer 2100 along the x-z plane, and FIG. 21B illustrates a cross-sectional view of bonded wafer 2100 along the y-z plane.

As shown in FIGS. 21A and 21B, a second staircase structure 2130 can be formed based on dielectric stack 530. Second staircase structure 2130 can include a plurality of staircases 2133, each staircase 2133 can include an insulating layer 2131 and a sacrificial layer 2132, formed from the patterning/etching of insulating material layer 531 and sacrificial material layer 532 of bonding wafer 1810. The structure and formation of second staircase structure 2130 can be referred to the structure and formation of first staircase structure 520 and are not described herein.

Referring to FIG. 28B, after the formation of the second staircase structure, a third dielectric fill structure can be formed over the second staircase structure (S2820). FIG. 22A illustrates a cross-sectional view of corresponding structure of bonded wafer 2200 along the x-z plane, and FIG. 22B illustrates a cross-sectional view of bonded wafer 2200 along the y-z plane.

As shown in FIGS. 22A and 22B, a third dielectric fill structure 2232 can be formed over second staircase structure 2130 so second staircase structure 2130 is positioned in third dielectric fill structure 2232. In some embodiments, a suitable CMP process and/or a recess etch can be performed to remove excessive portions of third dielectric fill structure 2232 and planarize a top surface of third dielectric fill structure 2232 and/or a top surface of bonded wafer 2200. The structure and formation of third dielectric fill structure 2232 can be referred to the structure and formation of first and second dielectric fill structures 624 and 634, and are not described herein.

Referring to FIG. 28B, after the formation of third dielectric fill structure, the GLS fill structure and the sacrificial layers of the second staircase structure can be removed to form a top GLS trench connected to second electrode-forming tunnels and exposing partial source via structure (S2821). FIG. 23A illustrates a cross-sectional view of corresponding structure of bonded wafer 2300 along the x-z plane, and FIG. 23B illustrates a cross-sectional view of bonded wafer 2300 along the y-z plane.

As shown in FIGS. 23A and 23B, GLS fill structure 1335 and sacrificial layers 2132 can be removed to form a top GLS trench 2235 connected to second electrode-forming tunnels 2334. A bottom of top GLS trench 2235 can expose partial source via structure 1625. The structure and formation of top GLS trench 2235 and second electrode-forming tunnels 2334 can be referred to the structure and formation of first GLS trench 1225 and first electrode-forming tunnels 1326, and are not described herein.

Referring to FIG. 28B, after the formation of top GLS trench and second electrode-forming tunnels, a conductive material can be deposited into top GLS trench and second electrode-forming tunnels to form a plurality of second electrode-forming layers and a second sacrificial source fill structure connected to one another (S2822). FIG. 24A illustrates a cross-sectional view of corresponding structure of bonded wafer 2400 along the x-z plane, and FIG. 24B illustrates a cross-sectional view of bonded wafer 2400 along the y-z plane.

As shown in FIGS. 24A and 24B, a conductive material can be deposited to fill in top GLS trench 2235 and second electrode-forming tunnels 2334 to form a plurality of second electrode-forming layers 2434 and a second sacrificial source fill structure 2435. The conductive material can include any suitable materials for forming gate electrodes of the 3D memory device. For example, the conductive material can include one or more of tungsten, aluminum, cobalt, polysilicon, and copper. In some embodiments, the conductive material includes tungsten. The structure and formation of second electrode-forming layers 2431 and second sacrificial source fill structure 2435 can be referred to the structure and formation of first electrode-forming layers 1426 and first sacrificial source fill structure 1425, and are not described herein. In some embodiments, a suitable planarization process (e.g., CMP and/or recess etch) is performed to remove excessive conductive material layer over a top surface of second sacrificial source fill structure 2435.

Referring to FIG. 28B, after the formation of the second sacrificial source fill structure and the second electrode-forming layers, the second sacrificial source fill structure can be removed to form and expose other gate electrodes and the partial source via structure, and another spacer layer can be formed over the other gate electrodes and to expose the partial source via structure (S2823). FIG. 25A illustrates a cross-sectional view of corresponding structure of bonded wafer 2500 along the x-z plane, and FIG. 25B illustrates a cross-sectional view of bonded wafer 2500 along the y-z plane.

As shown in FIGS. 25A and 25B, second sacrificial source fill structure 2435 can be removed and a plurality of other gate electrodes 2534 can be formed from second electrode-forming layers 2434, which are exposed by the removal of second sacrificial source fill structure 2435. Partial source via structure 1625 can be exposed by the removal of second sacrificial source fill structure 2435. Further, another spacer material layer can be formed over the exposed other gate electrodes 2534 and partial source via structure 1625 formed by the removal of second sacrificial source fill structure 2435. A suitable etching process (e.g., dry etch and/or wet etch) can be performed to remove the portion of the other spacer material layer and expose first source trench 1525. Another spacer layer 2528 can be formed over other gate electrodes 2534 and a second source trench 2535 can be formed surrounded by spacer layer 2528 and partial source via structure 1625. The structure and formation of other gate electrodes 2534, second source trench 2535, and another spacer layer 2528 can be referred to the structure and formation of gate electrodes 1526, first source trench 1525, and spacer layer 1528.

Referring to FIG. 28B, after the formation of second source trench and the other spacer layer, a source-forming material is formed in the second source trench to connect with the partial source via structure and form a source via structure (S2824). FIG. 26A illustrates a cross-sectional view of corresponding structure of bonded wafer 2600 along the x-z plane, and FIG. 26B illustrates a cross-sectional view of bonded wafer 2600 along the y-z plane.

As shown in FIGS. 26A and 26B, a source via structure 2635 can be formed by filling second source trench 2535 with a source-forming material that connects with partial source via structure 1625. In some embodiments, source via structure 2635 forms contact with source region 1627 and is insulated from gate electrodes 1526 and other gate electrodes 2534 by spacer layer 1528 and other spacer layer 2528. The source-forming material can be the same material that forms partial source via structure 1625. The structure and formation to deposit the source-forming material and form source via structure 2635 can be referred to the structure and formation of partial source via structure 1625 and spacer layer 1528 and are not described herein. In some embodiments, a suitable planarization process (e.g., CMP and/or recess etch) can be performed to remove any excessive source-forming material over a top surface of source via structure 2635. Accordingly, source via structure 2635 extending from a top surface of bonded wafer 2600 to substrate 322 can be formed.

Referring to FIG. 28B, after the formation of source via structure, a plurality of third via holes can be formed in the bonded wafer extending from a top surface of the bonded wafer to the other gate electrodes, and a contact region can be formed in the channel epitaxial portions at top portion of the bonded wafer (S2825). FIG. 27A illustrates a cross-sectional view of corresponding structure of bonded wafer 2700 along the x-z plane, and FIG. 27B illustrates a cross-sectional view of bonded wafer 2700 along the y-z plane.

As shown in FIGS. 27A and 27B, a plurality of third via holes can be formed in third dielectric fill structure 2232 of bonded wafer 2700. In some embodiments, the plurality of third via holes is formed in first staircase region 212-2. The third via holes can extend from the top surface of third dielectric fill structure 2232 to other gate electrodes 2534. In some embodiments, at least one of the third via holes is connected to one gate electrode 2534. In some embodiments, each one of third via holes is connected to one of other gate electrodes 2534.

The third via holes can be formed by any suitable methods. For example, a suitable etching process (e.g., dry etch and/or wet etch) can be performed to remove portions of third dielectric fill structures 2232 to form the third via holes. In some embodiments, an anisotropic dry etching process is performed for the formation of the third via holes. Further, a via-forming material is deposited into the third via holes to form a plurality of third via structures extending from the top surface of third dielectric fill structure 2232 to other gate electrodes 2534. The via-forming material can include any suitable material for forming third via structures 2722. The structure and formation of third via structures 2722 can be referred to the formation and structure of first and second via structures 1822 and 1832, and are not described herein.

Also, a contact region 2737 can be formed in channel epitaxial portion 836. Contact region 2737 can have a doping concentration higher than channel epitaxial portion 836. Contact region 2737 can be formed by any suitable methods that can form contact region 2737 of sufficiently high doping concentration. For example, a recess etch can be performed remove a portion of each channel epitaxial portion 836, and an epitaxial growth of a semiconductor material can be performed. An in-situ dopant growth can be performed to form contact region 2737 of desirably high dopant concentration. In another example, an ion implantation process can be performed to implant dopants of desirable dosage/concentration into channel epitaxial portion 836. In some embodiments, an ion implantation process is performed over channel epitaxial portion 836 to form contact region 2737. In some embodiments, contact region 2737 are connected to a bit line, adjoined and third via structures gate electrodes 1922 and 2722 are connected to word line signals, and source via structure 2635 is connected to a source line, of the 3D memory device.

It should be noted that, although the present disclosure describes the bonding of two wafers (e.g., base wafer and bonding wafer), a bonded wafer can include any suitable number of wafers. For example, more than two wafers can be bonded using the method disclosed by the present disclosure. In some embodiments, one wafer can be the base wafer, and more than one wafer can be bonded (e.g., employing flip-chip bonding) with the base wafer. Each wafer can include a staircase structure/dielectric stack with semiconductor sub-channels embedded therein. Wafers that are bonded with the base water can undergo thinning/thickness reduction to remove the substrate, retaining the staircase structures/dielectric stacks bonded with the base wafer. A multiple-stack 3D memory device can be formed. The via structures connected with the gate electrodes can be formed around the staircase structures/dielectric stacks. Source region and source via structure can also be formed using the disclosed method.

By using the disclosed method and structure, a desired number of wafers can be bonded to form a multiple-stack 3D memory device. Each wafer can include a dielectric stack of a desired number of dielectric pairs. The formation of dielectric pairs can be more controlled and the film quality can be improved. The dielectric pairs are less susceptible to film quality degradation. Also, the semiconductor channels, formed by connecting shorter and separately-formed semiconductor sub-channels, can have improved uniformity.

In some embodiments, a method for forming a memory device includes the following operations. First, a plurality of first semiconductor channels can be formed over a first wafer with a peripheral device and a plurality of first via structures neighboring the plurality of first semiconductor channels. The plurality of first semiconductor channels can extend along a direction perpendicular to a surface of the first wafer. Further, a plurality of second semiconductor channels can be formed over a second wafer with a plurality of second via structures neighboring the plurality of second semiconductor channels. The plurality of second semiconductor channels can extend along a direction perpendicular to a surface of the second wafer and a peripheral via structure. Further, the first wafer and the second wafer can be bonded to adjoin each one of the plurality of first semiconductor channels with a corresponding one of the plurality of second semiconductor channels along the direction perpendicular to the surface of the first wafer to form a plurality of adjoined semiconductor channels.

In some embodiments, a memory device includes a plurality of staircase structures stacked over a substrate along a direction perpendicular to a surface of the substrate. The plurality of staircase structures can be positioned in a dielectric fill structure over the substrate and each one of the plurality of staircase structures can include a plurality of gate electrodes separated by a plurality of insulating layers and extending along a direction parallel to the surface of the substrate. The memory device also includes a semiconductor channel extending from a top surface of a first one of the plurality of staircase structures through the plurality of staircase structures into the substrate. The memory device further includes a first portion of peripheral via structures extending through the dielectric fill structure and being connected to the plurality of gate electrodes of each one of the plurality of staircase structures and a second portion of peripheral via structures extending through the dielectric fill structure and being connected to a peripheral device over the substrate and neighboring the plurality of staircase structures.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
   a bonding structure comprising:
      an upper staircase structure in a first staircase region,
      an upper semiconductor sub-channel in a channel region,
      a first upper via structure in a second staircase region, and
      a second upper via structure in a peripheral region; and
   a base structure comprising:
      a substrate,
      a lower semiconductor sub-channel on the substrate and in the channel region,
      a lower staircase structure on the substrate and in the second staircase region,
      a first lower via structure in the second staircase region and electrically connected to a gate electrode of the lower staircase structure,
      a peripheral device on the substrate and structure in the peripheral region, and a second lower via structure in the peripheral region and electrically connected to the peripheral device;

wherein the base structure is bonded with the bonding structure at a bonding interface, the upper semiconductor sub-channel is electrically connected to the lower semiconductor sub-channel at the bonding interface, the first upper via structure is electrically connected to the first lower via structure at the bonding interface, and the second upper via structure is electrically connected to the second lower via structure at the bonding interface.

2. The memory device of claim 1, wherein the semiconductor first semiconductor sub-channel is electrically connected to the lower semiconductor sub-channel through an adjoined connection layer at the bonding interface.

3. The memory device of claim 2, wherein the adjoined connection layer comprises a doped polysilicon layer.

4. The memory device of claim 2, further comprising a source region in the substrate neighboring the lower semiconductor sub-channel and a drain region at a top portion of the of the upper semiconductor sub-channel, wherein the drain region and the source region each comprises a doped single crystalline silicon layer.

5. The memory device of 4, wherein a dopant polarity of the adjoined connection layer is same as a dopant polarity of the source region and the drain region.

6. The memory device of claim 1, wherein the first upper structure is connected to a word line, and the second lower via structure is connected to a source, a drain, and a gate of the peripheral device.

7. The memory device of claim 1, wherein the lower semiconductor sub-channel and the upper semiconductor sub-channel comprise a memory layer, a tunneling dielectric layer over the memory layer, a semiconductor channel layer over the tunneling dielectric layer; and a dielectric core layer over the semiconductor channel layer.

8. The memory device of claim 7, wherein the memory layer comprises a doped polysilicon layer; the tunneling dielectric layer comprises a combination of a silicon oxide layer, a silicon nitride layer, and another silicon oxide layer; the semiconductor channel layer comprises a polysilicon layer; and the dielectric core layer comprises a silicon oxide layer.

9. The memory device of claim 1, further comprising:
a first epitaxial semiconductor layer connected to the substrate at a bottom of the lower semiconductor sub-channel, wherein a top surface of the first epitaxial semiconductor layer is positioned between a first bottom gate electrode and a second bottom gate electrode from the substrate.

10. The memory device of claim 9, further comprising:
a second epitaxial semiconductor layer at a top of the upper semiconductor sub-channel, wherein a bottom surface of the second epitaxial semiconductor layer is positioned between a first top gate electrode and a second top gate electrode from a top surface of the upper stack structure.

11. The memory device of claim 4, further comprising a source via structure extending from the top surface of the bonding structure to the source region, wherein the source via structure is connected to a source line.

12. The memory device of claim 11, wherein:
the gate electrode and the source via structure comprise tungsten.

13. The memory device of claim 11, further comprising a contact region over the drain region, wherein the contact region is connected to a bit line.

14. The memory device of claim 1, wherein the first staircase region and the second staircase region are located on opposite sides of the channel region respectively.

15. The memory device of claim 1, wherein the base structure further comprises an other lower staircase structure on the substrate and in the first staircase region.

16. The memory device of claim 1, wherein the bonding structure further comprises a third upper via structure in the first staircase region and electrically connected to an other gate electrode of the upper staircase structure.

* * * * *